US012713818B2

(12) United States Patent
Kim et al.

(10) Patent No.: US 12,713,818 B2
(45) Date of Patent: Aug. 18, 2026

(54) DISPLAY DEVICE

(71) Applicant: SAMSUNG DISPLAY CO., LTD., Yongin-si (KR)

(72) Inventors: Si Kwang Kim, Yongin-si (KR); Jin Su Byun, Yongin-si (KR); Gi Heon Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 339 days.

(21) Appl. No.: 18/616,565

(22) Filed: Mar. 26, 2024

(65) Prior Publication Data

US 2025/0063923 A1 Feb. 20, 2025

(30) Foreign Application Priority Data

Aug. 18, 2023 (KR) ........................ 10-2023-0108203

(51) Int. Cl.

| | |
|---|---|
| ***G06K 9/00*** | (2022.01) |
| ***H10K 59/126*** | (2023.01) |
| ***H10K 59/40*** | (2023.01) |
| ***H10K 59/80*** | (2023.01) |
| *H10K 102/00* | (2023.01) |

(52) U.S. Cl.

CPC ......... *H10K 59/879* (2023.02); *H10K 59/126* (2023.02); *H10K 59/40* (2023.02); *H10K 2102/351* (2023.02)

(58) Field of Classification Search

CPC .... H10K 59/879; H10K 59/126; H10K 59/40; H10K 2102/351; H10K 59/8792; H10K 59/878; B60K 35/22

USPC ........................................................... 257/40

See application file for complete search history.

(56) References Cited

U.S. PATENT DOCUMENTS

| | | | | |
|---|---|---|---|---|
| 10,707,447 | B2 * | 7/2020 | Kim | H10K 59/122 |
| 11,038,151 | B2 * | 6/2021 | Ju | H10K 77/111 |
| 2010/0271721 | A1 | 10/2010 | Gaides et al. | |

FOREIGN PATENT DOCUMENTS

| | | | |
|---|---|---|---|
| CN | 109239830 | A | 1/2019 |
| CN | 113281925 | A | 8/2021 |
| KR | 10-2022-0012458 | A | 2/2022 |
| KR | 10-2023-0017968 | A | 2/2023 |
| KR | 10-2024-0013970 | A | 1/2024 |
| KR | 10-2024-0021327 | | 2/2024 |

* cited by examiner

*Primary Examiner* — Theresa T Doan

(74) *Attorney, Agent, or Firm* — F. CHAU & ASSOCIATES, LLC

(57) ABSTRACT

Provided is a display device which comprises a substrate, an emission layer including a plurality of light-emitting elements to emit lights and disposed on the substrate, and a light control layer disposed on the emission layer, wherein the light control layer includes a light-transmitting film that transmits the lights, and a light-blocking film that blocks the lights, the light-transmitting film includes, a first low-refractive light-transmitting film disposed on the light-blocking film, and a first high-refractive light-transmitting film alternately disposed with the light-blocking film, and a refractive index of the first low-refractive light-transmitting film is smaller than a refractive index of the first high-refractive light-transmitting film.

20 Claims, 13 Drawing Sheets

EA: EA1, EA2, EA3

DISPLAY DEVICE

CROSS-REFERENCE TO RELATED APPLICATION

This application claims priority from Korean Patent Application No. 10-2023-0108203 filed on Aug. 18, 2023, in the Korean Intellectual Property Office, the disclosure of which is incorporated by reference herein in its entirety.

BACKGROUND

1. Field of the Disclosure

The present disclosure generally relates to a display device. More particularly, the present disclosure relates to a display device with improved luminance and light emission efficiency.

2. Description of the Related Art

Modern display devices including an organic light-emitting display device are used in many different electronic devices such as TVs, cellular-phones, and watches, etc. Today, the demand of such display devices is getting higher in the automotive industry. However, images displayed on the display device placed in front of a driver or a passenger may be projected on the windshield at night. When this happens, such images may hinder or block the driver's view. Accordingly, controlling the viewing angle of the images displayed on the display device for vehicles is needed. In addition, controlling the viewing angle of images displayed on a display device in a vehicle, which can be seen by people passing by the vehicle, is needed to protect privacy of a driver.

SUMMARY

One aspect of the present disclosure provides a display device with improved luminance and light emission efficiency within an effective viewing angle range.

Another aspect of the present disclosure provides a display device with improved uniformity of luminance and light emission efficiency within the effective viewing angle range.

It should be noted that objects of the present disclosure are not limited to the above-mentioned object; and other objects of the present disclosure are apparent to those skilled in the art from the following descriptions.

According to an aspect of the present disclosure, a display device comprises a substrate, an emission layer including a plurality of light-emitting elements to emit lights and disposed on the substrate, and a light control layer disposed on the emission layer, wherein the light control layer includes a light-transmitting film that transmits the lights, and a light-blocking film that blocks the lights, the light-transmitting film includes, a first low-refractive light-transmitting film disposed on the light-blocking film, and a first high-refractive light-transmitting film alternately disposed with the light-blocking film, and a refractive index of the first low-refractive light-transmitting film is smaller than a refractive index of the first high-refractive light-transmitting film.

In an embodiment, the first low-refractive light-transmitting film overlaps the light-blocking film in a thickness direction of the substrate in a thickness direction of the substrate.

In an embodiment, the first high-refractive light-transmitting film does not overlap the light-blocking film in the thickness direction of the substrate in the thickness direction of the substrate.

In an embodiment, the first low-refractive light-transmitting film is disposed in a non-open area, and the first high-refractive light-transmitting film is disposed in an open area.

In an embodiment, the first high-refractive light-transmitting film is alternately arranged with the first low-refractive light-transmitting film.

In an embodiment, a side surface of the first high-refractive light-transmitting film is in direct contact with a side surface of the first low-refractive light-transmitting film to form a first interface.

In an embodiment, some of the lights are totally reflected at the first interface.

In an embodiment, some of the lights are refracted at the first interface toward a front side.

In an embodiment, an angle formed between a side surface and a lower surface of the first low-refractive light-transmitting film is 90 degrees.

In an embodiment, a thickness of the first low-refractive light-transmitting film is smaller than a thickness of the light-blocking film in the thickness direction of the substrate, and a thickness of the first high-refractive light-transmitting film is equal to a sum of the thickness of the first low-refractive light-transmitting film and the thickness of the light-blocking film.

In an embodiment, the thickness of the first low-refractive light-transmitting film is 1.5 to 10 times less than the thickness of the light-blocking film in the thickness direction of the substrate.

In an embodiment, the thickness of the first low-refractive light-transmitting film is equal to or less than 10 μm in the thickness direction of the substrate.

In an embodiment, the display device further comprises a touch sensor layer disposed between the emission layer and the light control layer, wherein the first low-refractive light-transmitting film is disposed on the light-blocking film and spaced apart from the touch sensor layer in the thickness direction of the substrate, and the light-blocking film overlaps a non-emission area and an emission area of the emission layer.

In an embodiment, the refractive index of the first low-refractive light-transmitting film is equal to or less than 97% of the refractive index of the first high-refractive light-transmitting film.

In an embodiment, a difference between the refractive index of the first low-refractive light-transmitting film and the refractive index of the first high-refractive light-transmitting film is equal to or greater than 0.05.

In an embodiment, the refractive index of the first low-refractive light-transmitting film is equal to or less than 1.5.

According to an aspect of the present disclosure, a display device comprises a substrate, an emission layer including a plurality of light-emitting elements and disposed on the substrate, a touch sensor layer disposed on the emission layer, and a light control layer disposed on the touch sensor layer, wherein the light control layer includes a light-transmitting film that transmits the lights and a light-blocking film that blocks the lights, wherein the light-transmitting film includes a first high-refractive light-transmitting film disposed in an open area, a first low-refractive light-transmitting film disposed in a non-open area, and a second low-refractive light-transmitting film, wherein refractive indices of the first and second low-refractive light-transmitting films are smaller than a refractive index of the first high-refractive light-transmitting film, and wherein the second low-refractive light-transmitting film is disposed on the first low-refractive light-transmitting film and the first high-refractive light-transmitting film.

In an embodiment, a side surface of the first high-refractive light-transmitting film is in direct contact with a side surface of the first low-refractive light-transmitting film to form a first interface, and an upper surface of the first high-refractive light-transmitting film is in direct contact with a lower surface of the second low-refractive light-transmitting film to form a second interface.

In an embodiment, some of the lights are refracted at the first interface toward a front side, and some others of the lights are refracted at the second interface toward a side surface.

According to an aspect of the present disclosure, a display device comprises a substrate, an emission layer including a plurality of light-emitting elements and disposed on the substrate, a touch sensor layer disposed on the emission layer, and a light control layer disposed on the touch sensor layer, wherein the light control layer includes a light-transmitting film that transmits the lights and a light-blocking film that blocks the lights, wherein the light-transmitting film includes a first low-refractive light-transmitting film disposed in a non-open area, a first high-refractive light-transmitting film disposed in an open area, and a second high-refractive light-transmitting film, wherein a refractive index of the first low-refractive light-transmitting film is smaller than refractive indices of the first and second high-refractive light-transmitting films, and wherein the second high-refractive light-transmitting film is disposed on the first low-refractive light-transmitting film and the first high-refractive light-transmitting film.

In an embodiment, a side surface of the first low-refractive light-transmitting film is in direct contact with a side surface of the first high-refractive light-transmitting film to form a first interface, and an upper surface of the first low-refractive light-transmitting film is in direct contact with a lower surface of the second high-refractive light-transmitting film to form a second interface.

In an embodiment, some of the lights are refracted at the first interface and the second interface toward a front side.

According to an embodiment of the present disclosure, the luminance and the light emission efficiency are improved within an effective viewing angle range of a display device.

According to an embodiment of the present disclosure, the uniformity of luminance and the uniformity of light emission efficiency is improved within an effective viewing angle range of a display device.

It should be noted that effects of the present disclosure are not limited to those described above and other effects of the present disclosure are apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present disclosure will now be described more fully hereinafter with reference to the accompanying drawings, in which preferred embodiments of the present disclosure are shown. This present disclosure may, however, be embodied in different forms and should not be construed as limited to the embodiments set forth herein. Rather, these embodiments are provided so that this disclosure is thorough and complete, and will filly convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

Hereinafter, embodiments of the present disclosure are described in detail with reference to the accompanying drawings.

Figure 1:
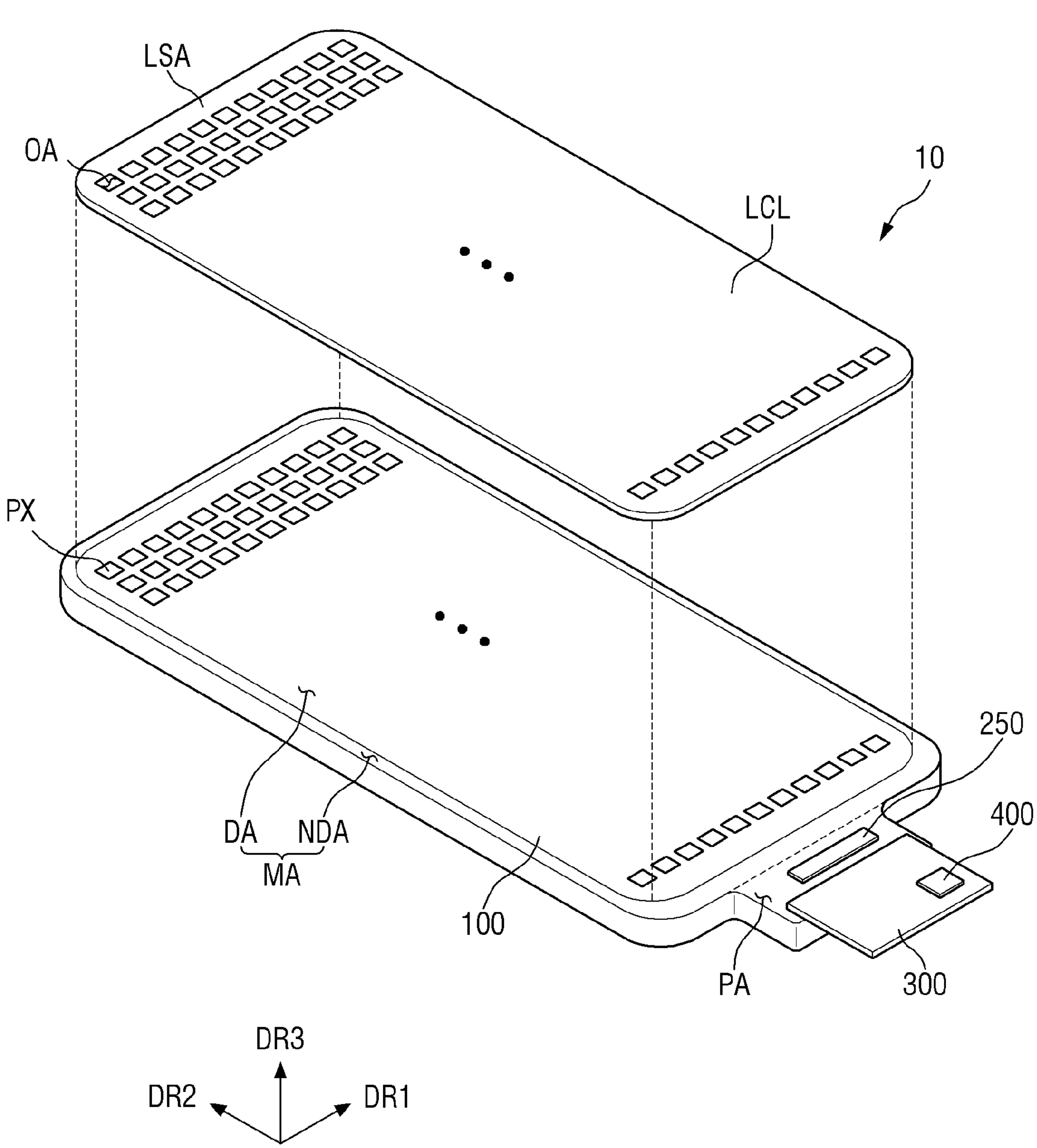
FIG. 1 is an exploded view of a display device according to an embodiment of the present disclosure.
Figure 2:
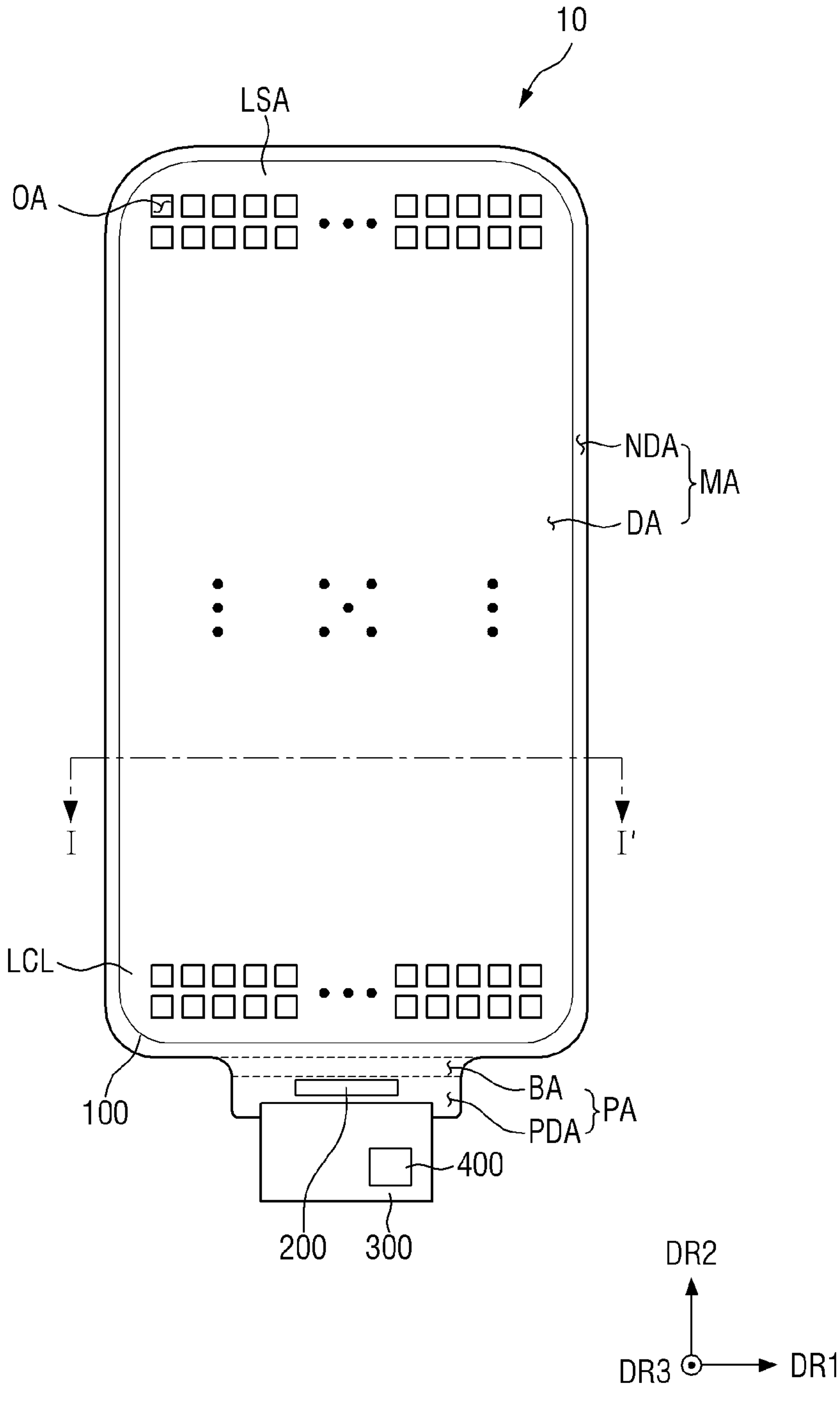
FIG. 2 is a plan view of a display device according to an embodiment of the present disclosure.
Figure 3:
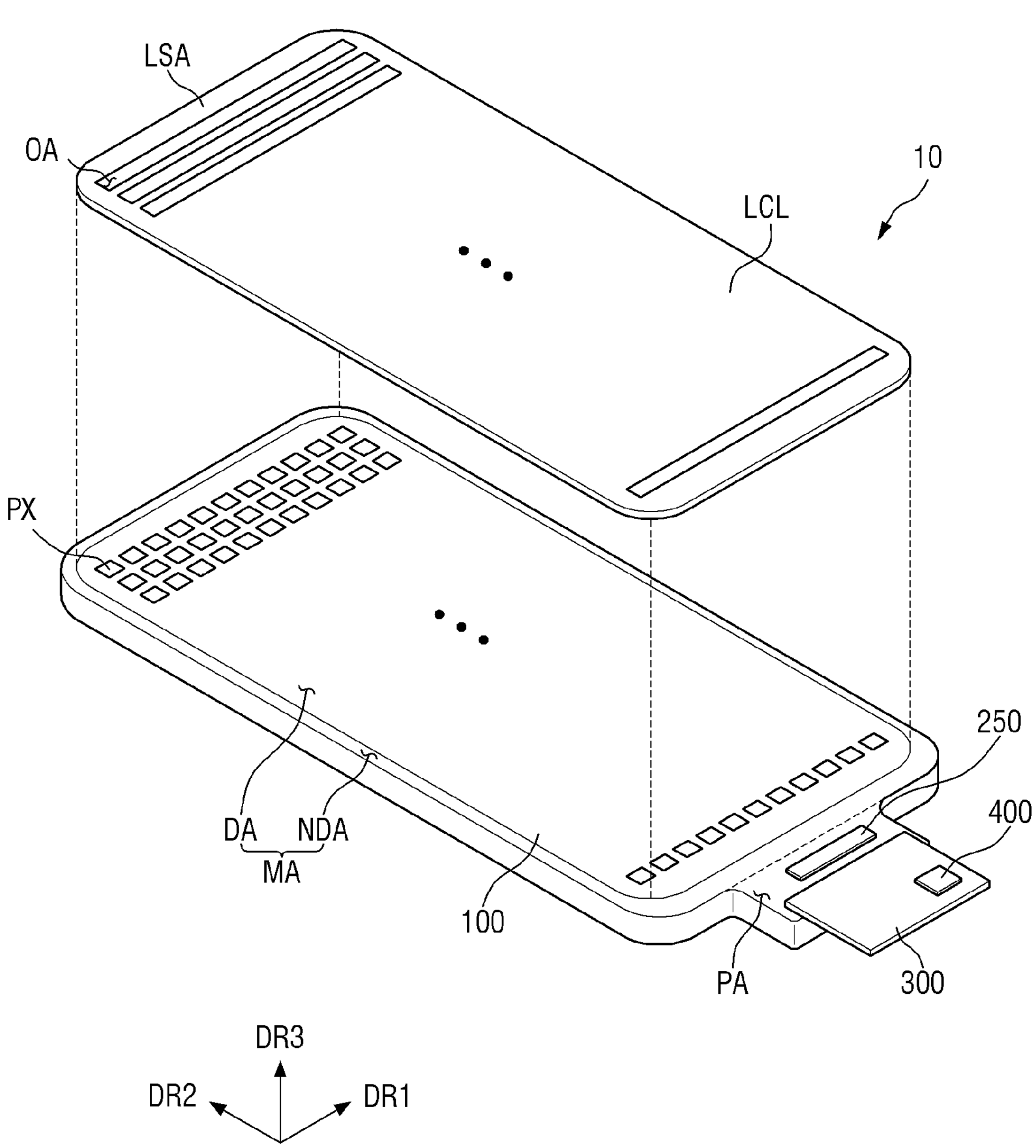
FIG. 3 is an exploded view of a display device according to another embodiment of the present disclosure.

FIG. 1 is an exploded view of a display device according to an embodiment of the present disclosure. FIG. 2 is a plan view of a display device according to an embodiment of the present disclosure. FIG. 3 is an exploded view of a display device according to another embodiment of the present disclosure.

Referring to FIGS. 1 to 3, a display device 10 is for displaying moving images or still images. The display device 1 is used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things (IoT). The display device 10 is one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10. It is, however, to be understood that the present disclosure is not limited thereto.

According to an embodiment of the present disclosure, the display device 10 includes a display panel 100, a display driving circuit 250, a circuit board 300, and a touch driving circuit 400.

The display panel 100 includes a plurality of pixels PX arranged in a first direction DR1 and a second direction DR2. Each of the pixels PX has a rectangular, square, or diamond shape when viewed from the top. For example, each of the pixels PX has a square shape when viewed from the top, as shown in the drawings. It is, however, to be understood that the present disclosure is not limited thereto. Each of the pixels PX has a variety of shapes such as polygonal, circular, and oval shape when viewed from the top, but is not limited thereto.

In the drawings, the first direction DR1 and the second direction DR2 horizontally intersect each other. For example, the first direction DR1 and the second direction DR2 are perpendicular to each other. In addition, a third direction DR3 is vertically intersect each of the first direction DR1 and the second direction DR2, respectively, for example.

The display panel 100 includes a main area MA and a protruding area PA protruding from one side of the main area MA along the second direction DR2.

The main area MA is formed in a rectangular plane having short sides in the first direction DR1 and long sides in the second direction DR2. Each of the corners where the short side in the first direction DR1 meets the long side in the second direction DR2 is rounded with a predetermined curvature or is a right angle. The shape of the display device 10 when viewed from the top is not limited to a quadrangular shape, but is formed in another polygonal shape, circular shape, or elliptical shape. The main area MA is, but is not limited to being, formed to be flat. The main area MA includes curved portions formed at left and right ends thereof. The curved portions have a constant curvature or varying curvatures.

The main area MA includes a display area DA where pixels are formed to display images and a non-display area NDA around the display area DA where no pixels are formed.

In addition to the pixels, scan lines, data lines, and power lines connected to the pixels are disposed in the display area DA. When the main area MA includes a curved portion, the display area DA is disposed on the curved portion. In such case, images of the display panel 100 can also be seen on the curved portion.

The non-display area NDA is defined as the area outside of the display area DA to the edge of the display panel 100. In the non-display area NDA, a scan driver for applying scan signals to scan lines and link lines connecting the data lines with the display driving circuit 250 are disposed.

The protruding area PA protrudes from one portion of the main area MA. For example, the protruding area PA protrudes from the bottom portion of the main area MA as shown in FIG. 2. The length of the protruding area PA in the first direction DR1 and the width of the protruding area PA in the second direction DR2 are smaller than the length and the width of the main area MA in the first direction DR1 and the second direction DR2. That is, the area of the protruding are PA is smaller than the area of the main area MA.

The protruding area PA includes a bending area BA and a pad area PDA. In such case, the pad area PDA is disposed on the bottom portion of the bending area BA in the second direction DR2, and the main area MA is disposed on the upper portion of the bending area BA in the second direction DR2. For example, the pad area PDA is disposed on the lower side of the bending area BA, and the main area MA is disposed on the upper side of the bending area BA.

The display panel 100 is formed to be flexible so that the display panel 100 can be curved, bent, folded, or rolled. For example, the display panel 100 is bent at the bending area BA in the third direction DR3, i.e., the thickness direction. In such case, the surface of the pad area PDA of the display panel 100 faces upward before the display panel 100 is bent, while the surface of the pad area PDA of the display panel 100 faces downward after the display panel 100 is bent. As a result, since the pad area PDA is disposed under the main area MA, the pad area PDA overlaps the main area MA.

Pads electrically connected to the display driving circuit 250 and the circuit board 300 are disposed in the pad area PDA of the display panel 100.

The display driving circuit 250 outputs signals and voltages for driving the display panel 100. For example, the display driving circuit 250 applies data voltages to the data lines. In addition, the display driving circuit 250 applies supply voltage to the power line and applies scan control signals to the scan driver. The display driving circuit 250 is implemented as an integrated circuit (IC) and is attached to the display panel 100 in a pad area PDA by a chip on glass (COG) technique, a chip on plastic (COP) technique, or an ultrasonic bonding. For example, the display driving circuit 250 is mounted on the circuit board 300.

The pads include display pads electrically connected to the display driving circuit 250 and touch pads electrically connected to touch lines.

The circuit board 300 is attached to the pads using an anisotropic conductive film. In this manner, the lead lines of the circuit board 300 are electrically connected to the pads. The circuit board 300 is a flexible printed circuit board, a printed circuit board, or a flexible film such as a chip-on-film.

The touch driving circuit 400 is disposed on the circuit board 300. The touch driving circuit 400 is implemented as an integrated circuit (IC) and is mounted on the circuit board 300.

The touch driving circuit 400 is connected to touch electrodes of a touch sensor layer TSU (see FIG. 4) of the display panel 100. Thus, the touch driving circuit 400 applies driving signals to the touch electrodes of the touch sensor layer TSU (see FIG. 4) and measures capacitances of the touch electrodes. The driving signals have driving pulses. The touch driving circuit 400 does not only determine whether a touch is input based on the capacitances, but also calculate touch coordinates of the position where the touch is input.

According to this embodiment, the display panel 100 of the display device 10 further includes a light control layer LCL.

The light control layer LCL is directly disposed on the main area MA of the display panel 100. For example, the light control layer LCL is incorporated into the display panel 100 and is directly disposed on the main area MA of the display panel 100. As the light control layer LCL is incorporated into the display panel 100, the thickness and the fabrication cost of the display device 10 are advantageously reduced compared to a display device in which a separate light control film is attached. For example, the light control layer LCL is not attached on the display panel 100 using a separate adhesive member, but may be formed directly through a process (e.g. a deposition process) for manufacturing the display panel 100, such as the thin-film transistor layer TFTL, the emission layer EML, the thin-film encapsulation layer TFEL, and the touch sensor layer TSU.

In some embodiments, the light control layer LCL is disposed on the display area DA of the main area MA. In this case, the light control layer LCL overlaps the display area DA of the main area MA in the third direction DR3. The light control layer LCL can adjust the viewing angle of light emitted from the display panel 100.

The light control layer LCL includes a plurality of open areas OA arranged in the first direction DR1 and the second direction DR2 and non-open areas LSA surrounding the open areas OA.

In the open areas OA, no light-blocking film LS (see FIG. 7A) is disposed. In this example, the open areas OA that transmit light and is extended in the third direction DR3 so that light is transmitted through the open areas OA.

Each of the open areas OA has a rectangular (i.e., square) shape when viewed from the top as shown in FIGS. 1 and 2, but the present disclosure is not limited thereto. Each of the open areas OA has a circular, oval, or polygonal shape when viewed from the top.

According to another embodiment, the open areas OA have a shape extended in the first direction DR1 or the second direction DR2. For example, as shown in FIG. 3, each of the open areas OA has a rectangular shape which is extended in the first direction DR1 and arranged in the second direction DR2. As another example, the open areas OA are extended in the second direction DR2 and arranged in the first direction DR1.

As shown in FIG. 1, when the open areas OA are arranged in the first direction DR1 and the second direction DR2, the viewing angle is controlled in both the first direction DR1 and the second direction DR2. As shown in FIG. 3, when the open areas OA are arranged in the first direction DR1 or the second direction DR2, the viewing angle is controlled in the first direction DR1 or the second direction DR2. That is, the arrangement and shape of the open areas OA are modified in various ways depending on the required direction in which the viewing angle is controlled.

The non-open areas LSA are the remaining areas of the light control layer LCL excluding the open areas OA. In the non-open areas LSA, the light-blocking film LS (see FIG. 7A) is disposed.

The light control layer LCL includes a light-blocking film LS that blocks light emitted from an emissive layer 172 (see FIG. 6) of the display panel 100 and a light-transmitting film LT that transmits the light. The structure of the light control layer LCL is described later in detail with reference to FIG. 7A and the like.

Figure 4:
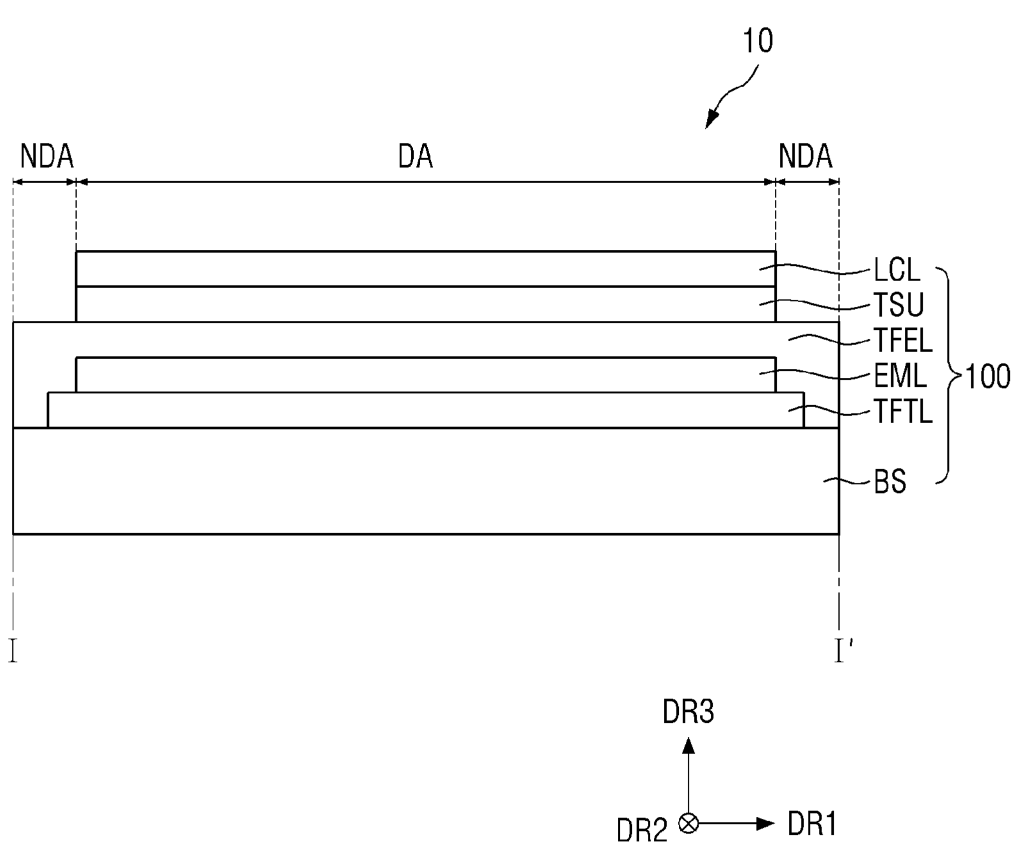
FIG. 4 is a cross-sectional view of the display device taken along line I-I' of FIG. 2.

FIG. 4 is a cross-sectional view of the display device taken along line I-I' of FIG. 2.

Referring to FIG. 4, the display device 10 includes the display panel 100 in which the light control layer LCL is incorporated. The display panel 100 includes a base member BS, a thin-film transistor layer TFTL, an emission layer EML, a thin-film encapsulation layer TFEL, a touch sensor layer TSU, and a light control layer LCL.

The base member BS includes a substrate. The substrate is made of an insulating material such as glass, quartz and polymer resin. Examples of the polymer material include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate includes a metallic material.

The substrate is a rigid substrate or a flexible substrate that can be bent, folded, rolled, and so on. When the substrate is a flexible substrate, the substrate is formed of, but is not limited to, polyimide (PI).

The thin-film transistor layer TFTL is disposed on the base member BS. On the thin-film transistor layer TFTL, scan lines, data lines, power supply lines, scan control lines, and routing lines connecting the pads with the data lines are formed as well as thin-film transistors in the pixels. Each of the thin-film transistors includes a gate electrode, a semiconductor layer, a source electrode, and a drain electrode.

The thin-film transistor layer TFTL is disposed in the display area DA and the non-display area NDA. Specifically, the thin-film transistors in the pixels, the scan lines, the data lines, and the power supply lines on the thin-film transistor layer TFTL are disposed in the display area DA. The scan control lines and the link lines on the thin-film transistor layer TFTL are disposed in the non-display area NDA.

The emission layer EML is disposed on the thin-film transistor layer TFTL. The light-emitting element layer EML includes pixels including a first electrode, an emissive layer and a second electrode, and a pixel-defining layer. The emissive layer is an organic emissive layer containing an organic material. Then, the emissive layer includes a hole transporting layer, an organic light-emitting layer, and an electron transporting layer. When a voltage is applied to the first electrode and a cathode voltage is applied to the second electrode through the thin-film transistor on the thin-film transistor layer TFTL, the holes and electrons move to the organic light-emitting layer through the hole transporting layer and the electron transporting layer, respectively such that the holes and electrons are combined in the organic light-emitting layer to emit light. The pixels on the emission layer EML are disposed in the display area DA.

The thin-film encapsulation layer TFEL is disposed on the emission layer EML. The thin-film encapsulation layer TFEL can prevent oxygen or moisture from permeating into the emission layer EML. To this end, a thin-film encapsulation layer TFEL includes at least one inorganic layer. The inorganic layer is, but not limited to, a silicon nitride layer, a silicon oxynitride layer, a silicon oxide layer, a titanium oxide layer, or an aluminum oxide layer. In addition, the thin-film encapsulation layer TFEL can protect the emission layer EML from foreign substances such as dust. To this end, the thin-film encapsulation layer TFEL includes at least one organic layer. The organic layer is formed of, but is not limited to, an acryl resin, an epoxy resin, a phenolic resin, a polyamide resin and a polyimide resin.

The thin-film encapsulation layer TFEL is disposed in the display area DA as well as the non-display area NDA. Specifically, the thin-film encapsulation layer TFEL covers the emission layer EML in the display area DA and the thin-film transistor layer TFTL in the non-display area NDA.

The touch sensor layer TSU is disposed on the thin-film encapsulation layer TFEL. As the touch sensor layer TSU is directly disposed on the thin-film encapsulation layer TFEL, the thickness of the display device 10 is reduced, compared to a display device in which a separate touch panel including the touch sensor layer TSU is attached on the thin-film encapsulation layer TFEL.

The touch sensor layer TSU includes touch electrodes for sensing a user's touch by capacitive sensing, and touch lines for connecting the pads with the touch electrodes. For example, the touch sensor layer TSU can sense a user's touch by self-capacitance sensing or mutual capacitance sensing.

The touch electrodes of the touch sensor layer TSU are disposed in a touch sensor area overlapping the display area DA in the third direction DR3. The touch lines of the touch sensor layer TSU are disposed in a touch peripheral area overlapping the non-display area NDA.

The light control layer LCL is disposed on the touch sensor layer TSU. The light control layer LCL is disposed such that the light control layer LCL overlaps the display area DA. The light control layer LCL absorbs or blocks some of the lights that are emitted from the emission layer EML and travel out of a predetermined angle with respect to the third direction DR3. That is, the light control layer LCL can control the viewing angle.

Although not shown in the drawings, the display device 10 further includes a cover window. The cover window is further disposed on the light control layer LCL. The light control layer LCL and the cover window are attached together by a transparent adhesive member such as an optically clear adhesive (OCA) film.

Figure 5:
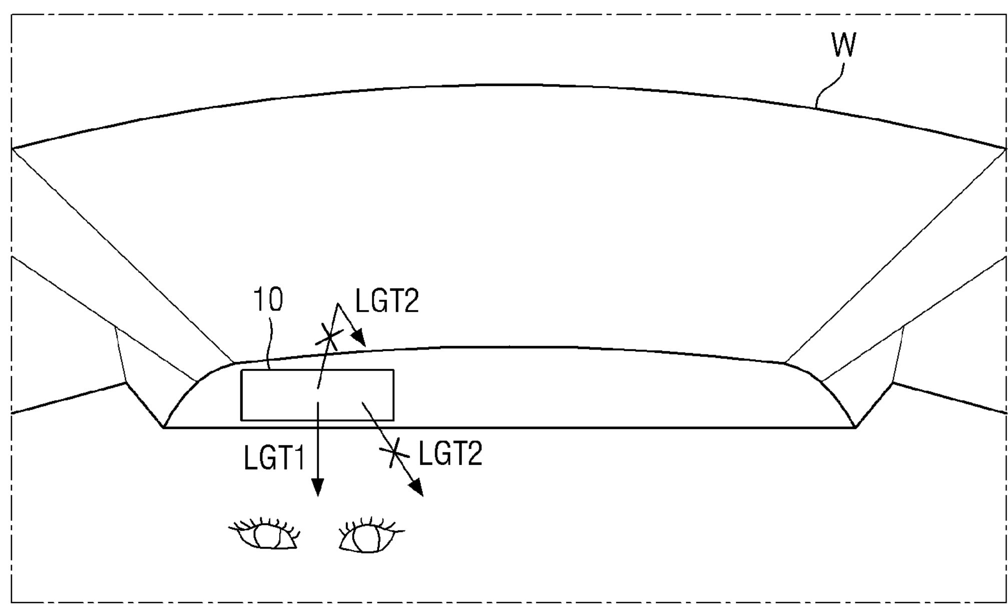
FIG. 5 is a view schematically illustrating a display device according to an embodiment applied to a vehicle.

FIG. 5 is a view schematically illustrating a display device according to an embodiment applied to a vehicle.

Referring to FIG. 5, the display device 10 according to an embodiment is applied to a vehicle, for example. The vehicle includes a body that forms the exterior of the vehicle and an interior space defined by the body. The body includes a windshield W that protects a driver and passengers and allows the driver to see through. As shown in FIG. 5, the display device 10 is provided in the interior space.

According to the embodiment, the display device 10 is placed on a dashboard provided in the interior space. For example, the display device 10 is disposed on the dashboard in front of the driver's seat to provide a plurality of information including but not limited to speed of a vehicle to the driver, is disposed on the dashboard in front of the passenger seat to provide a plurality of information including but not limited to entertainment to passengers, or is disposed in the center of the dashboard to provide a plurality of information including but not limited to map information. In the example shown in FIG. 5, the display device 10 is disposed on the dashboard in front of the driver's seat, and the driver watches a display screen of the display device 10.

The driver can recognize (or sec) images on the display screen of the display device 10 through a light LGT1 directly emitted from the display device 10 toward the driver. Other lights LGT2 among the lights emitted from the display device 10 are reflected off from the windshield W and provided to the driver. When this happens, the images projected on the windshield W block the driver's view. In view of the above, in the display device 10 according to the embodiment, by adjusting the viewing angle on the front side (the side facing the driver), especially the vertical viewing angle, of the lights LGT1 and LGT2 emitted from the display device 10, other lights LGT2 are prevented from being reflected off from the windshield W and provided to the driver.

In addition, other lights LGT2 emitted from the display device 10 are provided toward people passing by a vehicle. When this happens, the display device 10 causes privacy issues. In view of the above, in the display device 10 according to the embodiment, by adjusting the viewing angle on the front side (the side facing the driver), especially the horizontal viewing angle, of the lights LGT1 and LGT2 emitted from the display device 10, images displayed on the display device 10 for the vehicle placed in front of the driver are prevented from being seen by people passing by the vehicle.

The viewing angle is adjusted through the light control layer LCL. The viewing angle is limited to a predetermined angle range through the light control layer LCL. For example, the viewing angle is equal to or less than 35° from the normal which is an imaginary line facing the driver and extended in a direction perpendicular to the display surface of the display device 10. In some embodiments, an angle equal to or less than 35° from the normal is defined as the effective viewing angle, but the present disclosure is not limited thereto.

Figure 6:
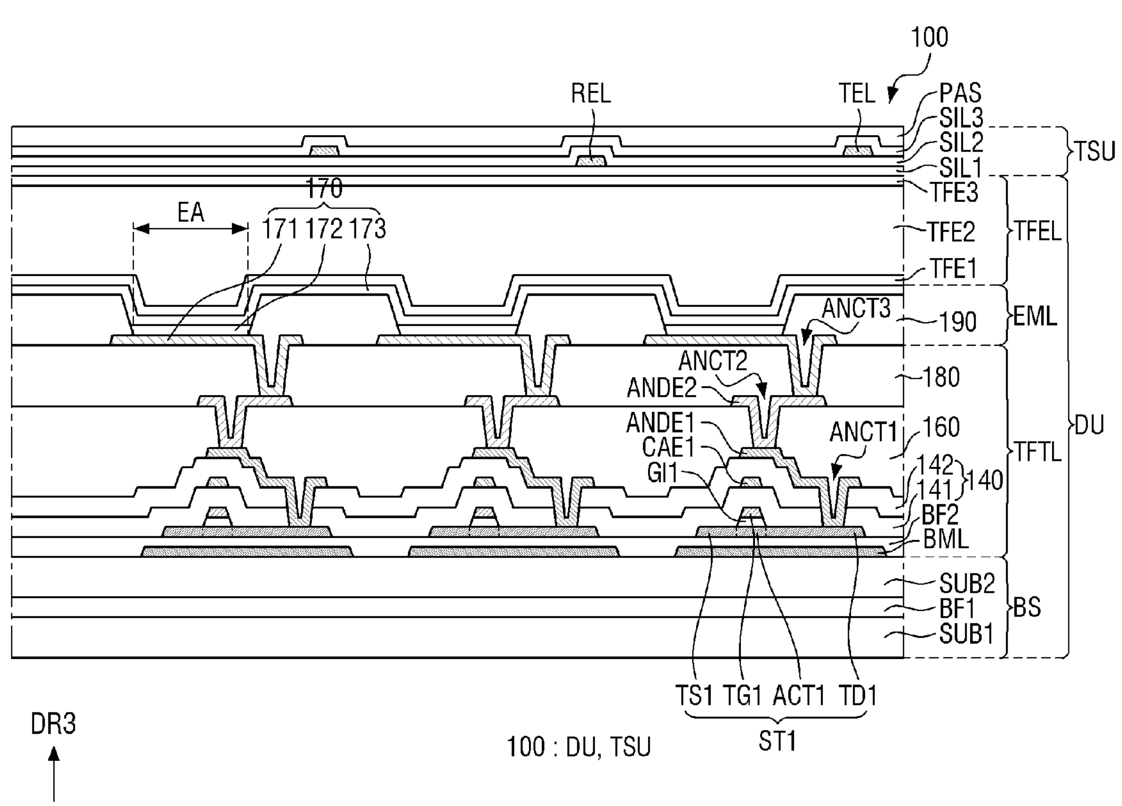
FIG. 6 is a cross-sectional view illustrating an example of a display panel according to an embodiment of the present disclosure.

FIG. 6 is a cross-sectional view illustrating an example of a display panel according to an embodiment of the present disclosure.

Referring to FIG. 6, the display panel 100 includes a display layer DU and a touch sensor layer TSU disposed on the display layer DU. The display layer DU includes a base member BS, a thin-film transistor layer TFTL, an emission layer EML, and a thin-film encapsulation layer TFEL.

The base member BS includes a first substrate SUB1, a first buffer film BF1 disposed on the first substrate SUB1, and a second substrate SUB2 disposed on the first buffer film BF1.

The first substrate SUB1 and the second substrate SUB2 are made of an insulating material such as glass, quartz and polymer resin. Examples of the polymer material include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate includes a metallic material.

The first substrate SUB1 and the second substrate SUB2 are a rigid substrate or a flexible substrate that can be bent, folded, rolled, and so on. When the substrate is a flexible substrate, the substrate is formed of, but is not limited to, polyimide (PI).

The first buffer film BF1 is a film for protecting a first thin-film transistor ST1 and the emissive layer 172 from moisture permeating through the first substrate SUB1 and the second substrate SUB2, which are vulnerable to permeation of moisture. The first buffer film BF1 is made up of multiple inorganic films alternately stacked on one another. For example, the first buffer film BF1 is made up of multiple films in which one or more inorganic films of a silicon nitride layer, a silicon oxynitride layer, a silicon oxide layer, a titanium oxide layer and an aluminum oxide layer are alternately stacked on one another.

The thin-film transistor layer TFTL includes a bottom metal layer BML, a second buffer film BF2, a first thin-film transistor ST1, a first gate insulator GI1, a first interlayer dielectric layer 141, a first capacitor electrode CAE1, a second interlayer dielectric layer 142, a first anode connection electrode ANDE1, a first organic layer 160, a second anode connection electrode ANDE2, and a second organic layer 180.

The bottom metal layer BML is disposed on the second substrate SUB2. The bottom metal layer BML overlaps a first active layer ACT1 of the first thin-film transistor ST1 in the third direction DR3 to prevent current leakage when the light is incident on the first active layer ACT1 of the first thin-film transistor ST1. The bottom metal layer BML is made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. However, in another example, the bottom metal layer BML is eliminated.

The second buffer film BF2 is disposed on the bottom metal layer BML. The second buffer film BF2 is a film for protecting a first thin-film transistor ST1 and an emissive layer 172 from moisture permeating through the first substrate SUB1 and the second substrate SUB2, which are vulnerable to moisture permeation. The second buffer film BF2 is made up of multiple inorganic layers sequentially stacked on one another. For example, the second buffer film BF2 is made up of multiple layers in which one or more inorganic layers of a silicon nitride layer, a silicon oxynitride layer, a silicon oxide layer, a titanium oxide layer and an aluminum oxide layer are alternately stacked on one another.

The first active layer ACT1 of the first thin film transistor ST1 is disposed on the second buffer layer BF2. The first active layer ACT1 of the first thin-film transistor ST1 includes polycrystalline silicon, monocrystalline silicon, low-temperature polycrystalline silicon, amorphous silicon, or oxide semiconductor. Since the first active layer ACT1 of the first thin-film transistor ST1 which is not covered by the first gate insulating layer GI1 but is exposed is doped with impurities or ions, the first active layer ACT1 can have conductivity. Therefore, a first source electrode TS1 and a first drain electrode TD1 of the first active layer ACT1 of the first thin-film transistor ST1 are formed.

The first gate insulator GI1 is disposed on the first active layer ACT1 of the first thin film transistor ST1. Although the first gate insulating layer GI1 is disposed between the first gate electrode TG1 and the first active layer ACT1 of the first thin film transistor ST1 in the third direction DR3 as shown in FIG. 5, the present disclosure is not limited thereto. In another example, the first gate insulating layer GI1 is disposed between the first interlayer dielectric layer 141 and the first active layer ACT1 or disposed between the first interlayer dielectric layer 141 and the second buffer layer BF2. The first gate insulating layer GI1 is formed of an inorganic layer, for example, a silicon nitride layer, a silicon oxynitride layer, a silicon oxide layer, a titanium oxide layer, or an aluminum oxide layer.

The first gate electrode TG1 of the first thin-film transistor ST1 is disposed on the first gate insulating layer GI1. The first gate electrode TG1 of the first thin-film transistor ST1 overlaps the first active layer ACT1 in the third direction DR3. The first gate electrode TG1 of the first thin-film transistor ST1 is made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first interlayer dielectric layer 141 is disposed on the first gate electrode TG1 of the first thin-film transistor ST1. The first interlayer dielectric layer 141 is formed of an inorganic layer, for example, a silicon nitride layer, a silicon oxynitride layer, a silicon oxide layer, a titanium oxide layer, or an aluminum oxide layer. The first interlayer dielectric layer 141 includes a number of inorganic layers.

A first capacitor electrode CAE1 is disposed on the first interlayer dielectric layer 141. The first capacitor electrode CAE1 overlaps the first gate electrode TG1 of the first thin film transistor ST1 in the third direction DR3 (i.e., thickness direction). Since the first interlayer dielectric layer 141 has a predetermined dielectric constant, a capacitor is formed by the first capacitor electrode CAE1, the first gate electrode TG1, and the first interlayer dielectric layer 141 disposed therebetween. The first capacitor electrode CAE1 is made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 is disposed on the first capacitor electrode CAE1. The second interlayer dielectric layer 142 is formed of an inorganic layer, for example, a silicon nitride layer, a silicon oxynitride layer, a silicon oxide layer, a titanium oxide layer, or an aluminum oxide layer. The second interlayer dielectric layer 142 includes a number of inorganic layers.

A first anode connection electrode ANDE1 is disposed on the second interlayer dielectric layer 142. The first anode connection electrode ANDE1 is connected to a first drain electrode TD1 of the first thin-film transistor ST1 through a first anode contact hole ANCT1 that penetrates the first interlayer dielectric layer 141 and the second interlayer dielectric layer 142 to expose the first drain electrode TD1 of the first thin-film transistor ST1. The first anode connection electrode ANDE1 is made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The first organic layer 160 is disposed on the first anode connection electrode ANDE1 for planarization. The first organic layer 160 is formed as an organic layer such as an acryl resin, an epoxy resin, a phenolic resin, a polyamide resin, and a polyimide resin.

A second anode connection electrode ANDE2 is disposed on the first organic layer 160. The second anode connection electrode ANDE2 is connected to the first anode connection electrode ANDE1 through a second anode contact hole ANCT2 that penetrates through the first organic layer 160 to expose the first anode connection electrode ANDE1. The second anode connection electrode ANDE2 is made up of a single layer or multiple layers of one of molybdenum (Mo), aluminum (Al), chromium (Cr), gold (Au), titanium (Ti), nickel (Ni), neodymium (Nd), and copper (Cu) or an alloy thereof.

The second organic layer 180 is disposed on the second anode connection electrode ANDE2. The second organic layer 180 is formed as an organic layer such as an acryl resin, an epoxy resin, a phenolic resin, a polyamide resin, and a polyimide resin.

In FIG. 6, the first thin-film transistor ST1 is implemented as a top-gate transistor in which the first gate electrode TG1 is located above the first active layer ACT1. It is, however, to be understood that the present disclosure is not limited thereto. The first thin-film transistor ST1 is implemented as a bottom-gate transistor in which the first gate electrode TG1 is located below the first active layer ACT1, or as a double-gate transistor in which the first gate electrodes TG1 are disposed above and below the first active layer ACT1.

An emission layer EML is disposed on the second organic layer 180. The emission layer EML includes light-emitting elements 170 and a bank 190. Each of the light-emitting elements 170 includes a first light-emitting electrode 171, an emissive layer 172, and a second light-emitting electrode 173.

The first light-emitting electrode 171 is formed on the second organic layer 180 and connected to the second anode connection electrode ANDE2 through a third anode contact hole ANCT3 that penetrates through the second organic layer 180 to expose the second anode connection electrode ANDE2.

The first light-emitting electrode 171 is formed on the second organic layer 180 and connected to the second anode connection electrode ANDE2 through a third anode contact hole ANCT3 that penetrates through the second organic layer 180 to expose the second anode connection electrode ANDE2.

In the top-emission organic light-emitting diode that light exits from the emissive layer 172 toward the second light-emitting electrode 173, the first light-emitting electrode 171 is made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and copper (Cu).

The bank 190 partitions the first light-emitting electrode 171 on the second organic layer 180 to serve to define an emission area EA. For example, each of the light-emitting elements 170 is disposed between the banks 190. The bank 190 is formed to cover the edge of the first light-emitting electrode 171. The bank 190 is formed of an organic layer such as an acryl resin, an epoxy resin, a phenolic resin, a polyamide resin, and a polyimide resin.

In the emission area EA, the first light-emitting electrode 171, the emissive layer 172, and the second light-emitting electrode 173 are stacked on one another sequentially in the third direction DR3 so that holes from the first light-emitting electrode 171 and electrons from the second light-emitting electrode 173 are combined with each other in the emissive layer 172 to emit light.

The emissive layer 172 is formed on the first light-emitting electrode 171 and the bank 190. The emissive layer 172 includes an organic material to emit light of a certain color. For example, the emissive layer 172 includes a hole transporting layer, an organic material layer, and an electron transporting layer.

The second light-emitting electrode 173 is disposed on the emissive layer 172. The second light-emitting electrode 173 is formed to cover the emissive layer 172. The second light-emitting electrode 173 is a common layer formed across all of the emission areas EA. Although not shown in the drawings, a capping layer is formed on the second light-emitting electrode 173 in some implementations.

In the top-emission structure, the second light-emitting electrode 173 is formed of a transparent conductive oxide (TCO) such as indium tin oxide (ITO) and indium zinc oxide (IZO) that can transmit light, or a semi-transmissive conductive material such as magnesium (Mg), silver (Ag) and an alloy of magnesium (Mg) and silver (Ag). When the second light-emitting electrode 173 is formed of a semi-transmissive conductive material, the light extraction efficiency is increased by using microcavities.

The thin-film encapsulation layer TFEL is disposed on the second light-emitting electrode 173. The thin-film encapsulation layer TFEL includes at least one inorganic film to prevent permeation of oxygen or moisture into the emission layer. In addition, the thin-film encapsulation layer TFEL includes at least one organic layer to protect the emission layer from particles such as dust. For example, the thin-film encapsulation layer TFEL includes a first encapsulation film TFE1, a second encapsulation film TFE2, and a third encapsulation film TFE3.

The first encapsulation film TFE1 (e.g., a first inorganic encapsulation film) is disposed on the second light-emitting electrode 173. The first encapsulation film TFEL is an inorganic film made up of a single layer or multiple layers. The first encapsulation film TFE1 is made up of multiple films in which one or more inorganic films of a silicon nitride layer, a silicon oxynitride layer, a silicon oxide layer, a titanium oxide layer, and an aluminum oxide layer are alternately stacked on one another, or a single film.

The second encapsulation film TFE2 (e.g., a first organic encapsulation film) is disposed on the first encapsulation film TFE1. The second encapsulation film TFE2 is an inorganic film made up of a single layer or multiple layers. The second encapsulation layer TFE2 includes a polymer-based material. Such polymer-based material includes polyethylene terephthalate, polyethylene naphthalate, polycarbonate, polyimide, polyethylene sulfonate, polyoxymethylene, polyarylate, hexamethyldisiloxane, acrylic resins (e.g., polymethyl methacrylate, polyacrylic acid, etc.) or any combination thereof.

The third encapsulation film TFE3 (e.g., a second inorganic encapsulation film) is disposed on the second encapsulation film TFE2. The third encapsulation film TFE3 is an inorganic film made up of a single layer or multiple layers. The third encapsulation film TFE3 includes the same material as the first encapsulation film TFE1. For example, the third encapsulation film TFE3 is made up of multiple films in which one or more inorganic films of a silicon nitride layer, a silicon oxynitride layer, a silicon oxide layer, a titanium oxide layer and an aluminum oxide layer are alternately stacked on one another, or a single film.

The thickness of the second encapsulation film TFE2 is greater than the thicknesses of the first encapsulation film TFEL and the third encapsulation film TFE3 respectively. For example, the thickness of the second encapsulation film TFE2 ranges from 3.3 μm to 6.6 μm, and the thicknesses of the first encapsulation film TFE1 and the third encapsulation film TFE3 range from 0.55 μm to 1.1 μm. It should be understood, however, that the present disclosure is not limited thereto.

The touch sensor layer TSU is disposed on the thin-film encapsulation layer TFEL. The touch sensor layer TSU includes a plurality of touch electrodes for sensing a user's touch by capacitive sensing, and touch lines connecting the plurality of touch electrodes with a touch driver. For example, the touch sensor layer TSU senses a user's touch by mutual capacitance sensing or self-capacitance sensing. However, the present disclosure is not limited thereto. For example, the touch sensor layer TSU senses a touch pencil.

According to another embodiment, the touch sensor layer TSU is disposed on a separate substrate disposed on the display layer DU. In this instance, the substrate supporting the touch sensor layer TSU is a sealing member sealing the display layer DU.

The plurality of touch electrodes of the touch sensor layer TSU is disposed in the touch sensor area overlapping the display area. The touch lines of the touch sensor layer TSU are disposed in the touch peripheral area overlapping the non-display area.

The touch sensor layer TSU includes a first touch insulating film SIL1, first touch electrodes REL, a second touch insulating film SIL2, second touch electrodes TEL, and a third touch insulating film SIL3.

The first touch insulating film SIL1 is disposed on the thin-film encapsulation layer TFEL. The first touch insulating film SIL1 has insulating properties and optical features. The first touch insulating film SIL1 includes at least one inorganic film. For example, the first touch insulating film SIL1 is an inorganic layer including at least one selected from the group consisting of: a silicon nitride layer, a silicon oxynitride layer, a silicon oxide layer, a titanium oxide layer and an aluminum oxide layer. Optionally, the first touch insulating film SIL1 is eliminated.

The first touch electrode REL is disposed on the first touch insulating film SIL1. The first touch electrode REL does not overlap the light-emitting elements 170. The first touch electrode REL is made up of a single layer of molybdenum (Mo), titanium (Ti), copper (Cu), aluminum (Al), or indium tin oxide (ITO), or is made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

According to the embodiment, the first touch electrodes REL do not overlap the emission area EA, but overlap the bank 190 in the third direction DR3 as shown in FIG. 6.

The second touch insulating film SIL2 covers the first touch electrodes REL and the first touch insulating film SIL1. The second touch insulating film SIL2 has insulating properties and optical features. For example, the second touch insulating film SIL2 is made of one of the above-listed materials as the material of the first touch insulating layer SIL1.

The second touch electrodes TEL are disposed on the second touch insulating film SIL2. The second touch electrodes TEL does not overlap the light-emitting elements 170. The second touch electrodes TEL are made up of a single layer of molybdenum (Mo), titanium (Ti), copper (Cu), aluminum (Al), or indium tin oxide (ITO), or are made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

According to the embodiment, the second touch electrodes TEL do not overlap the emission area EA, but overlap the bank 190 in the third direction DR3 as shown in FIG. 6.

The third touch insulating film SIL3 covers the second touch electrodes TEL and the second touch insulating film SIL2. The third touch insulating film SIL3 has insulating properties and optical features. The third touch insulating film SIL3 is made of one of the above-listed materials as the material of the second touch insulating film SIL2.

The refractive indexes of the first touch insulating film SIL1, the second touch insulating film SIL2, and the third touch insulating film SIL3, which are inorganic films, are equal to or greater than the refractive indexes of the first encapsulation film TFE1 and the third encapsulation film TFE3. For example, the refractive indexes of the first touch insulating film SIL1, the second touch insulating film SIL2, and the third touch insulating film SIL3 range from 1.55 to 1.7. Herein, the refractive index is a value measured under standard conditions of approximately 20° C. and 1 atm using light of approximately 550 nm.

In some embodiments, the first touch insulating film SIL1, the second touch insulating film SIL2, and the third touch insulating film SIL3 are organic films. For example, the first touch insulating film SIL1, the second touch insulating film SIL2, and the third touch insulating film SIL3 are organic films such as an acrylic resin, an epoxy resin, a phenolic resin, a polyamide resin, and a polyimide resin.

In this case, the first touch insulating film SIL1, the second touch insulating film SIL2. and the third touch insulating film SIL3 are high-refractive organic films having a high refractive index. For example, the refractive indexes of the first touch insulating film SIL1, the second touch insulating film SIL2, and the third touch insulating film SIL3 range from 1.55 to 1.7.

Furthermore, nanoparticles such as zirconium oxide (ZrOx) and titanium oxide (TiOx) are contained to increase the refractive index. The size of the nanoparticles is equal to or less than approximately 50 μm.

The touch sensor layer TSU further includes a planarization film PAS disposed on the third touch insulating film SIL3 for providing a flat surface. The planarization film PAS is formed of an organic layer such as an acryl resin, an epoxy resin, a phenolic resin, a polyamide resin and a polyimide resin.

The refractive index of the planarization film PAS is equal to the refractive index of one of the first touch insulating film SIL1, the second touch insulating film SIL2, and the third touch insulating film SIL3. For example, the refractive index of the planarization film PAS ranges from 1.55 to 1.7.

When the planarization film PAS is an organic film, nanoparticles such as zirconium oxide (ZrOx) and titanium oxide (TiOx) are contained to increase the refractive index. The size of the nanoparticles is equal to or less than approximately 50 μm.

Figure 7A:
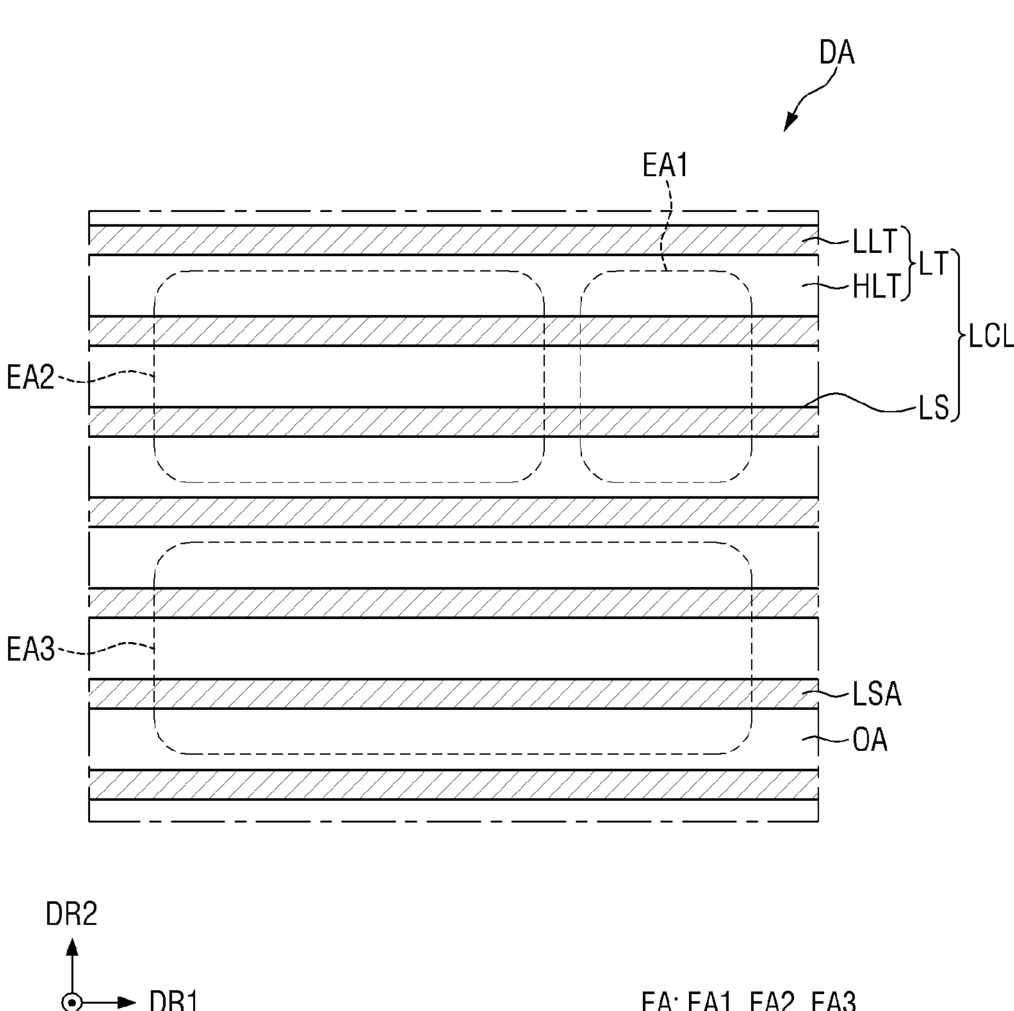
FIG. 7A is a plan view illustrating a part of a display area according to an embodiment of the present disclosure.
Figure 7A:
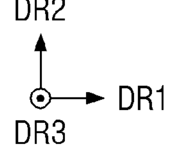
Figure 7B:
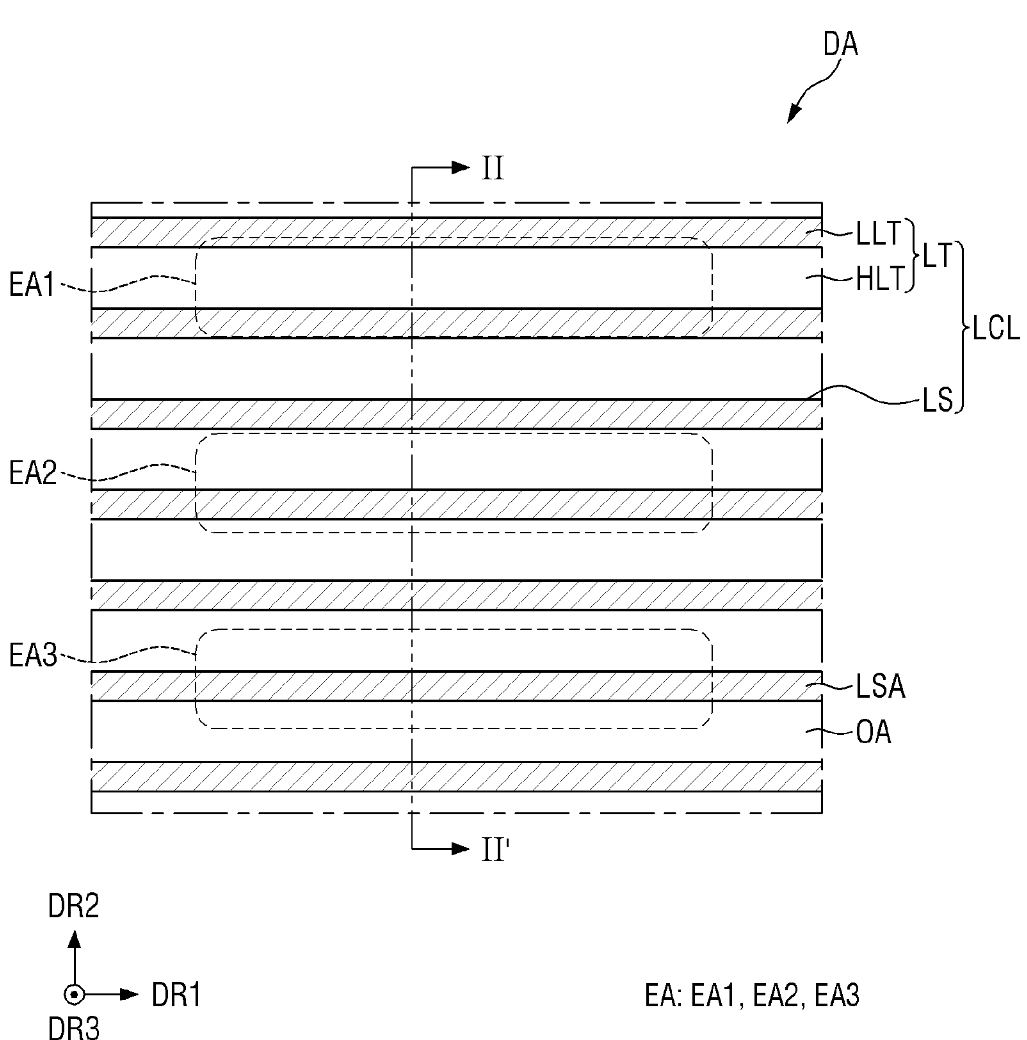
FIG. 7B is a plan view illustrating a part of a display area according to another embodiment of the present disclosure.
Figure 8:
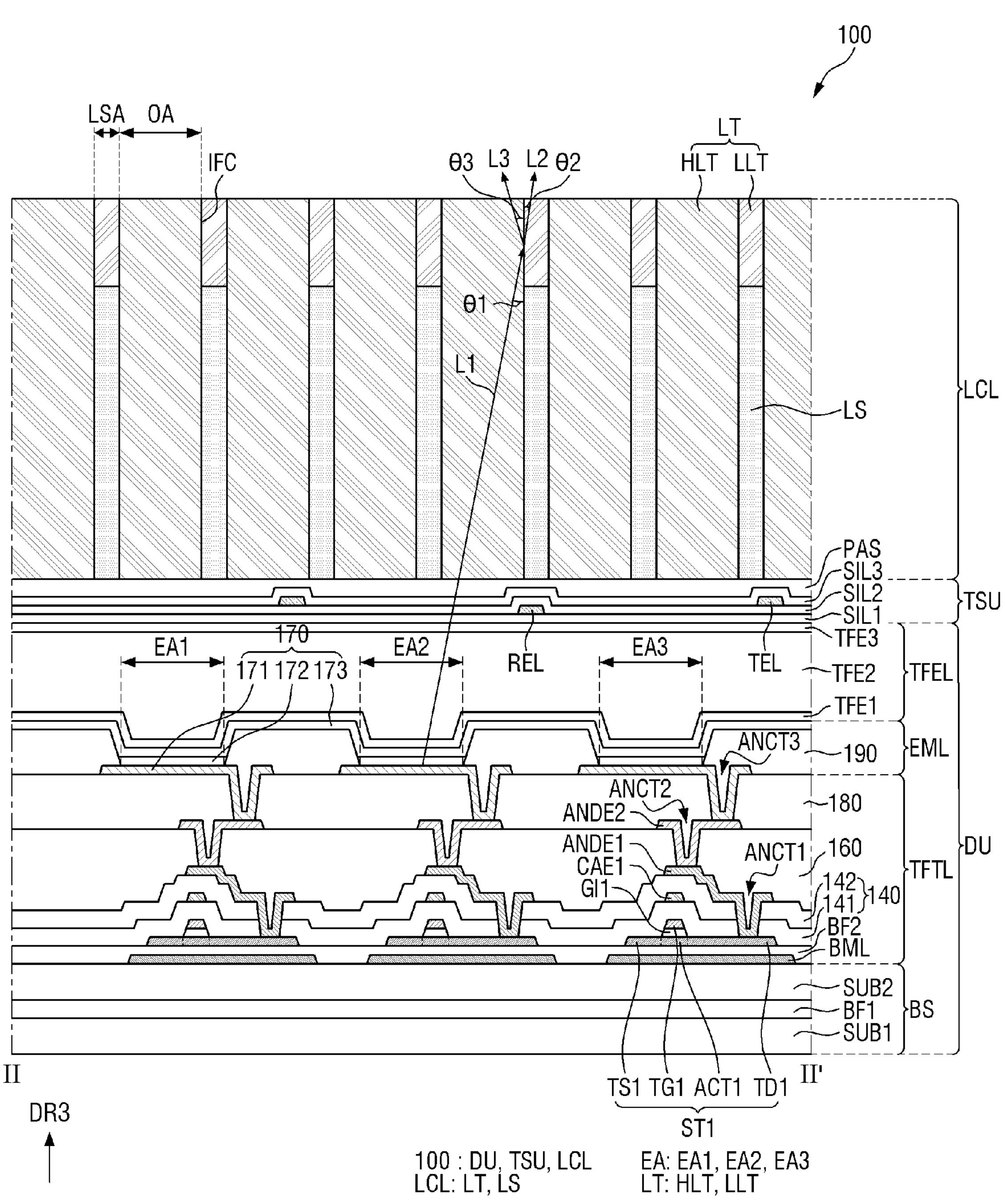
FIG. 8 is a cross-sectional view of a display panel and a light control layer taken along line II-II' of FIG. 7B according to an embodiment of the present disclosure.
Figure 9:
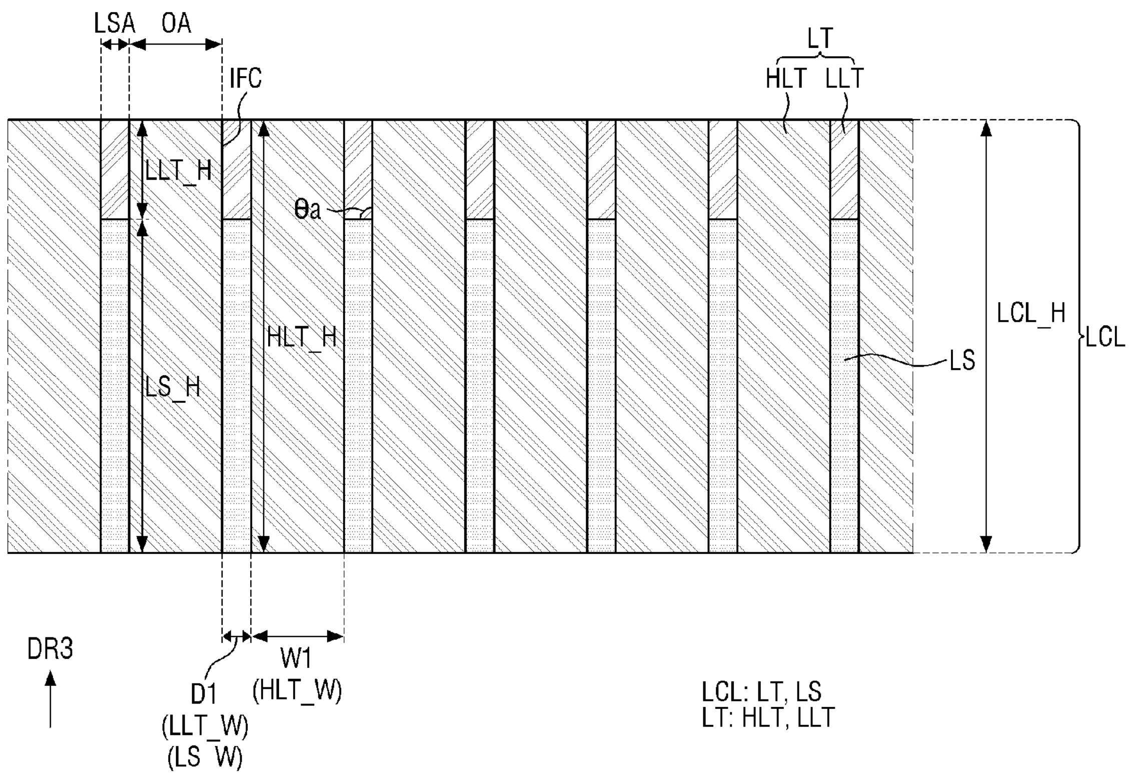
FIG. 9 is a cross-sectional view of the light control layer according to the embodiment.

FIG. 7A is a plan view illustrating a part of a display area according to an embodiment of the present disclosure. FIG. 7B is a plan view illustrating a part of a display area according to another embodiment of the present disclosure. FIG. 8 is a cross-sectional view of a display panel and a light control layer taken along line II-II' of FIG. 7B according to an embodiment of the present disclosure. FIG. 9 is a cross-sectional view of the light control layer according to the embodiment.

Referring to FIGS. 7A to 9 in conjunction with FIGS. 1 to 3, the display area DA of the display device 10 includes a plurality of emission areas EA. In the emission areas EA, lights generated by the light-emitting elements exit to the outside.

The plurality of emission areas EA is defined by the bank 190. That is, each of the emission areas EA is disposed between the adjacent banks 190. For example, the plurality of emission areas EA overlaps the emissive layer 172 disposed within the openings of the bank 190. In the emission area EA, the first light-emitting electrode 171, the emissive layer 172, and the second light-emitting electrode 173 overlap one another and are sequentially stacked on one another in the third direction DR3.

In some embodiments, the plurality of emission areas EA1, EA2, and EA3 includes a first emission area EA1, a second emission area EA2, and a third emission area EA3. Although three types of emission areas EA are included in the display area DA in the drawings, the present disclosure is not limited thereto.

The first emission area EA1 emits a first color, the second emission area EA2 emits a second color, and the third emission area EA3 emits a third color. The first color has a red wavelength range, the second color has a green wavelength range, and the third color has a blue wavelength range. The red wavelength ranges approximately from 600 nm to 750 nm, the green wavelength ranges approximately from 480 nm to 560 nm, and the blue wavelength ranges approximately from 370 nm to 460 nm. It should be understood, however, that the embodiments of the present disclosure are not limited thereto.

Each of the first to third emission areas EA1, EA2, and EA3 has a rectangular, square, diamond shape, or in any combination thereof, when viewed from the top. For example, each of the first to third emission areas EA1, EA2, and EA3 has a rectangular shape with rounded corners as shown in FIGS. 7A and 7B, but the present disclosure is not limited thereto.

According to the embodiment, as shown in FIG. 7A, the first to third emission areas EA1, EA2, and EA3 have different areas. For example, the third emission area EA3 is greater than the first emission area EA1 and the second emission area EA2, and the second emission area EA2 is greater than the first emission area EA1.

In addition, according to an embodiment of the present disclosure, as shown in FIG. 7A, the first emission area EA1 and the second emission area EA2 are arranged side by side in the first direction DR1. The third emission area EA3 is arranged side by side with the first emission area EA1 and the second emission area EA2 in the second direction DR2.

According to another embodiment, as shown in FIG. 7B, each of the first to third emission areas EA1, EA2, and EA3 has the equal area. In addition, each of the first to third emission areas EA1, EA2, and EA3 is extended in the first direction DR1 and is arranged side by side in the second direction DR2. According to yet another embodiment, each of the first to third emission areas EA1, EA2 and EA3 is extended in the second direction DR2 and arranged side by side in the first direction DR1.

In the display device 10 according to this embodiment shown in FIGS. 7A and 7B, the open areas OA and the non-open areas LSA are extended in the first direction DR1, like the display device 10 according to the embodiment of FIG. 3.

The emission areas EA of the display area DA overlap the open areas OA and the non-open areas LSA in the third direction DR3. For example, as shown in FIG. 8, the first to third emission areas EA1, EA2, and EA3 overlap the open areas OA and the non-open areas LSA in the third direction DR3.

In the open areas OA, no light-blocking film LS of the light control layer LCL is disposed. In the non-open areas LSA, the light-blocking film LS of the light control layer LCL is disposed.

The light control layer LCL is disposed on the touch sensor layer TSU. The light control layer LCL controls the viewing angle of lights emitted from the emissive layer 172. For example, when lights emitted from the emissive layer 172 travel at a predetermined angle or less with respect to the third direction DR3, the lights exit to the outside. On the other hand, when the lights emitted from the emissive layer 172 travel out of the predetermined angle with respect to the third direction DR3, the lights are absorbed or blocked by the light-blocking film LS and cannot exit to the outside.

The light control layer LCL includes a light-transmitting film LT and a light-blocking film LS.

The light-blocking film LS is disposed in the non-open areas LSA. The light-blocking film LS is disposed between the touch sensor layer TSU and a low-refractive light-transmitting film LLT in the third direction DR3. The upper surface of the light-blocking film LS is in direct contact with the lower surface of the low-refractive light-transmitting film LLT. According to the embodiment, the area of the upper surface of the light-blocking film LS is equal to the area of the lower surface of the low-refractive light-transmitting film LLT, when viewed from the top, but the present disclosure is not limited thereto.

The light-blocking film LS surrounds at least a part of the high-refractive light-transmitting film HLT disposed within the opening of the open area OA. According to another embodiment, the light-blocking film LS is alternately arranged with the high-refractive light-transmitting film HLT in the first direction DR1 or the second direction DR2 as shown in FIG. 3.

The light-blocking film LS absorbs or blocks lights emitted from the emissive layer 172. The light-blocking film LS includes a light-blocking organic material. For example, the light-blocking film LS is a photosensitive resin capable of absorbing or blocking light, and includes an organic material containing an organic black pigment such as carbon black.

In some embodiments, the light-blocking film LS overlaps non-emission areas as well as the emission areas EA in the third direction DR3. For example, the light-blocking film LS overlaps not only the emissive layer 172 disposed in the emission areas EA, but also the bank 190 disposed in the non-emission areas in the third direction DR3.

The light-transmitting film LT is disposed on the touch sensor layer TSU. For example, the light-transmitting film LT is disposed on the planarization film PAS of the touch sensor layer TSU. The light-transmitting film LT is disposed in the open area OA and the non-open area LSA.

The light-transmitting film LT transmits light emitted from the emissive layer 172. The light-transmitting film LT includes a transparent organic material. For example, the light-transmitting film LT includes an organic film such as an acryl resin, an epoxy resin, a phenolic resin, a polyamide resin and a polyimide resin. According to another embodiment, the light-transmitting film LT includes silicon oxynitride or silicon oxide. The light-transmitting film LT includes a high-refractive light-transmitting film HLT and a low-refractive light-transmitting film LLT. The high-refractive light-transmitting film HLT is disposed in the open area OA, and the low-refractive light-transmitting film LLT is disposed in the non-open area LSA. The low-refractive light-transmitting film LLT is disposed on the light-blocking film LS and spaced apart from the touch sensor layer TSU in the third direction DR3.

As depicted in FIG. 8, the low-refractive light-transmitting film LLT surrounds at least a part of the high-refractive light-transmitting film HLT disposed within the opening of the open area OA. According to another embodiment, the low-refractive light-transmitting film LLT is alternately arranged with the high-refractive light-transmitting film HLT in the first direction DR1 or the second direction DR2 as shown in FIG. 3.

The high-refractive light-transmitting film HLT is in direct contact with the touch sensor layer TSU. The high-refractive light-transmitting film HLT is disposed between the light-blocking film LS and the low-refractive light-transmitting film LLT in a horizontal direction perpendicular to the third direction DR3. According to the embodiment, the high-refractive light-transmitting film HLT is be in the form of a polygonal pillar, such as a cylinder, an elliptical pillar, and a square pillar, when viewed from the top.

In some embodiments, a plurality of high-refractive light-transmitting films HLT is disposed in the open areas OA and spaced apart from one another along a horizontal direction perpendicular to the third direction DR3. The high-refractive light-transmitting films HLT is equally spaced apart from one another, but the present disclosure is not limited thereto. Thus, a spacing between the adjacent high-refractive light-transmitting films HLT is different.

As shown in FIG. 9, a first distance D1 which is the distance between the high-refractive light-transmitting films HLT in the horizontal direction perpendicular to the third direction DR3 is equal to the width LS_W of the light-blocking films LS and the width LLT_W of the low-refractive light-transmitting films LLT disposed between the high-refractive light-transmitting films HLT. According to an embodiment, the first distance D1 is approximately 1 μm to 4 μm.

A first width W1 which is the width HLT_W of the high-refractive light-transmitting films HLT is greater than the first distance D1. According to an embodiment, the first width W1 is approximately 5 μm to 10 μm.

In the display device 10 according to this embodiment, the refractive index of low-refractive light-transmitting film LLT is smaller than the refractive index of the high-refractive light-transmitting film HLT. Accordingly, the luminance, the light emission efficiency, the luminance uniformity, and uniformity of the light emission efficiency are improved within the effective viewing angle range of the display device 10. The effective viewing angle range refers to a range within the effective viewing angle that allows lights emitted from the emissive layer 172 to reach a user or driver without being blocked by the light control layer LCL. Although the effective viewing angle is 35° in the following descriptions, the present disclosure is not limited thereto.

Specifically, the refractive index of low-refractive light-transmitting film LLT is smaller than the refractive index of the high-refractive light-transmitting film HLT. Accordingly, a first light L1 emitted from the emissive layer 172 and incident at a first angle θ1 on an interface IFC between low-refractive light-transmitting film LLT and the high-refractive light-transmitting film HLT passes through the interface IFC between low-refractive light-transmitting film LLT and the high-refractive light-transmitting film HLT to become a second light L2, or passes through the interface IFC between low-refractive light-transmitting film LLT and the high-refractive light-transmitting film HLT to become a third light L3.

The third light L3 refers to the first light L1 after the third light L3 is totally reflected off the interface IFC between low-refractive light-transmitting film LLT and the high-refractive light-transmitting film HLT. If the first angle θ1 is less than 90° (the critical angle of total-reflection), the first light L1 is totally reflected as the third light L3. The critical angle refers to the angle formed by the first light L1 and the normal line perpendicular to the interface IFC between the low-refractive light-transmitting film LLT and the high-refractive light-transmitting film HLT. The third light L3 exits at a third angle θ3, which is equal to the first angle θ1, at the interface IFC between low-refractive light-transmitting film LLT and the high-refractive light-transmitting film HLT.

In this embodiment, if the first angle θ1 is smaller than the effective viewing angle, the first light L1 exits to the outside by total-reflection like the third light L3. Accordingly, the luminance of the display device 10 within the effective viewing angle range is improved by the lights having the first angle θ1 smaller than the effective viewing angle range. As a result, the light emission efficiency of the display device 10 is improved within the effective viewing angle range.

The second light L2 refers to the light that passes through the interface IFC between low-refractive light-transmitting film LLT and the high-refractive light-transmitting film HLT. If the first angle θ1 is greater than 90° (the critical angle of total-reflection), the first light L1 is transmitted as the second light L2. The second light L2 exits at a second angle θ2, which is less than the first angle θ1, at the interface IFC between low-refractive light-transmitting film LLT and the high-refractive light-transmitting film HLT.

In this embodiment, if the first angle θ1 is greater than the effective viewing angle, the first light L1 exits at the second angle θ2 which is smaller than the effective viewing angle at the interface IFC between low-refractive light-transmitting film LLT and the high-refractive light-transmitting film HLT, like the second light L2. That is, the first light L1 having the first angle θ1 greater than the effective viewing angle is converted into the second light L2 having the second angle θ2 smaller than the effective viewing angle to exit to the outside. Accordingly, the luminance of the display device 10 is improved within the effective viewing angle range by converting the lights having the first angle θ1 greater than the effective viewing angle into the second angle θ2 within the effective viewing angle range. As a result, the light emission efficiency of the display device 10 is improved within the effective viewing angle range.

For example, lights outside the effective viewing angle range (lights not within the effective viewing angle range) are blocked from exiting to the outside by increasing the thickness LS_H of the light-blocking film LS. In this instance, the luminance and light emission efficiency of the display device 10 decreases. In contrast, since the display device 10 includes the low-refractive light-transmitting film LLT and the high-refractive light-transmitting film HLT, lights outside the effective viewing angle range (lights not within the effective viewing angle range) are converted into lights within the effective viewing angle range. Accordingly, the luminance and the light emission efficiency of the display device 10 are improved.

In some embodiments, the refractive index of the low-refractive light-transmitting film LLT is equal to or less than approximately 97% of the refractive index of the high-refractive light-transmitting film HLT. According to an embodiment, the refractive index of the low-refractive light-transmitting film LLT is equal to or less than 1.5. Herein, the refractive index is a value measured under conditions of 20° C. and 1 atm using light of 550 nm. In some embodiments, a difference between the refractive index of the low-refractive light-transmitting film LLT and the refractive index of the high-refractive light-transmitting film HLT is equal to or greater than 0.05.

If the refractive index of the low-refractive light-transmitting film LLT is greater than 97% of the refractive index of the high-refractive light-transmitting film HLT, or if the difference between the refractive index of the low-refractive light-transmitting film LLT and the refractive index of the high-refractive light-transmitting film HLT is less than 0.05, lights having the first angle θ1 greater than the effective viewing angle do not exit at the second angle θ2 within the effective viewing angle range. In this case, the refractive index of the low-refractive light-transmitting film LLT is equal to or less than 97% of the refractive index of the high-refractive light-transmitting film HLT, or the difference between the refractive index of the low-refractive light-transmitting film LLT and the refractive index of the high-refractive light-transmitting film HLT is equal to or greater than 0.05 to improve the luminance of the display device 10 within the effective viewing angle range.

As depicted in FIG. 9, the thickness LS_H of the light-blocking film LS is greater than the thickness LLT_H of the low-refractive light-transmitting film LLT. For example, the thickness LS_H of the light-blocking film LS is approximately 1.5 to 10 times greater than the thickness LLT_H of the low-refractive light-transmitting film LLT. Accordingly, the thickness LS_H of the light-blocking film LS is approximately 15 μm to 40 μm, and the thickness LLT_H of the low-refractive light-transmitting film LLT is equal to or less than approximately 10 μm.

In this case, the thickness HLT_H of the high-refractive light-transmitting film HLT is equal to the sum of the thickness LS_H of the light-blocking film LS and the thickness LLT_H of the low-refractive light-transmitting film LLT. Accordingly, the thickness HLT_H of the high-refractive light-transmitting film HLT is approximately 25 μm to 50 μm.

If the thickness LS_H of the light-blocking film LS is equal to or 1.5 times greater than the thickness LLT_H of the low-refractive light-transmitting film LLT, the viewing angle control is improved by preventing lights outside the effective viewing angle range from exiting to the outside. If the thickness LS_H of the light-blocking film LS is 10 times greater or less than the thickness LLT_H of the low-refractive light-transmitting film LLT, the range of the first angle θ1 of the first light L1 that reaches the interface IFC between the low-refractive light-transmitting film LLT and the high-refractive light-transmitting film HLT increases. Accordingly, more lights from the outside of the effective viewing angle range is converted into lights within the effective viewing angle range so that the luminance and the light emission efficiency of the display device 10 is further improved.

In other embodiments, the angle θa formed by the side surface of the low-refractive light-transmitting film LLT with the bottom surface is 90 degrees. In other words, the side surface of the low-refractive light-transmitting film LLT is a vertical surface. As the interface IFC between the low-refractive light-transmitting film LLT and the high-refractive light-transmitting film HLT is vertically formed, the first light L1 exits with the second angle θ2 greater than zero degree after the first light L1 passes through the interface IFC between the low-refractive light-transmitting film LLT and the high-refractive light-transmitting film HLT. For example, all of the first lights L1 passing through the interface IFC between the low-refractive light-transmitting film LLT and the high-refractive light-transmitting film HLT do not exit at the front viewing angle (i.e., the viewing angle of zero degree), but at the second angle θ2 which is greater than zero degree within the effective viewing angle range. As a result, the uniformity of the luminance and the uniformity of the light emission efficiency is improved within the effective viewing angle range.

Figure 10:
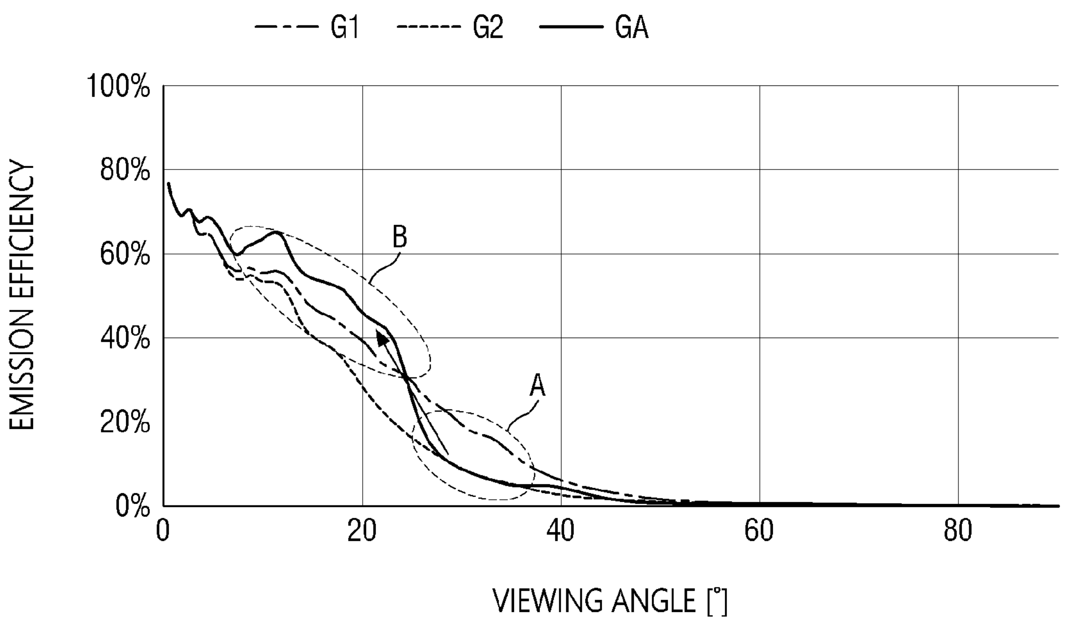
FIG. 10 is a graph illustrating the light emission efficiency versus the viewing angle of the light control layers according to Example and Comparative Examples.

FIG. 10 is a graph illustrating the light emission efficiency versus the viewing angle of the light control layers of Example and Comparative Examples.

Referring to FIG. 10 in conjunction with FIGS. 8 and 9, a first curve G1 corresponding to Comparative Example 1 wherein the thickness LCL_H of the light control layer LCL is 25 μm shows the light emission efficiency versus the viewing angle of the light control layer LCL. A second curve G2 corresponding to Comparative Example 2 wherein the thickness LCL_H of the light control layer LCL is 15 μm shows the light output efficiency versus the viewing angle of the light control layer LCL.

In Comparative Examples 1 and 2, the light control layers LCL do not include the low-refractive light-transmitting film LLT. The high-refractive light-transmitting film HLT and the light-blocking film LS are arranged such that the high-refractive light-transmitting film HLT and the light-blocking film LS cross each other. Of Comparative Example 1, the thickness HLT_H of the high-refractive light-transmitting film HLT and the thickness LS_H of the light-blocking film LS are 25 μm respectively. Of Comparative Example 2, the thickness HLT_H of the high-refractive light-transmitting film HLT and the thickness LS_H of the light-blocking film LS are 15 μm respectively.

A third curve GA corresponding to Example wherein the thickness LCL_H of the light control layer LCL is 25 μm shows the light emission efficiency versus the viewing angle of the light control layer LCL. In Example represented by the third graph GA, the thickness HLT_H of the high-refractive light-transmitting film HLT is 25 μm, the thickness LS_H of the light-blocking film LS is 15 μm, and the thickness LLT_H of the low-refractive light-transmitting film LLT is 10 μm.

In the light control layers LCL of Comparative Examples 1 and 2 and Example, the refractive index of the high-refractive light-transmitting film HLT is 1.532, and in the light control layer LCL of Example, the refractive index of the low-refractive light-transmitting film LLT is 1.47.

In area A (near the effective viewing angle of 35 degrees), the third curve GA has a lower light emission efficiency than the first curve G1. Specifically, even though the light control layer LCL of Example has the same thickness LS_H of the light-blocking film LS as the light control layer LCL of Comparative Example 1, the light control layer LCL of Comparative Example 1 shows the lower light emission efficiency near the effective viewing angle.

In addition, in area A (near the effective viewing angle of 35 degrees), the third curve GA has a light emission efficiency compared to that of the second curve G2. Specifically, even though the light control layer LCL of Example has the thickness LS_H of the light-blocking film LS lower than that of the light control layer LCL of Comparative Example 2, the third curve GA shows a comparable light emission efficiency near the effective viewing angle.

Accordingly, the viewing angle is more efficiently controlled compared to Comparative Examples as the light control layer LCL of Example includes the high-refractive light-transmitting film HLT and the low-refractive light-transmitting film LLT.

In area B (within the effective viewing angle), the third curve GA has a high light emission efficiency than the first curve G1 and the second curve G2. Specifically, even though the light control layer LCL of Example has the thickness LS_H of the light-blocking film LS equal to or lower than that of the light control layers LCL of Comparative Examples, the third curve GA shows a higher emission efficiency within the effective viewing angle.

Accordingly, the luminance and the light emission efficiency are improved within the effective viewing angle range compared to Comparative Examples as the light control layer LCL of Example includes the high-refractive light-transmitting film HLT and the low-refractive light-transmitting film LLT.

In addition, the light emission efficiency value of the third curve GA increases steeply between areas A and B. Accordingly, the uniformity of luminance and the uniformity of light emission efficiency within the effective viewing angle range are improved as the angle θa formed by the side surface and the lower surface of the low-refractive light-transmitting film LCL of the light control layer LCL according to this embodiment becomes 90 degrees.

Hereinafter, display devices according to other embodiments of the present disclosure are described. In the following description, the same or similar elements are denoted by the same or similar reference numerals, and redundant descriptions are omitted or briefly described.

Figure 11:
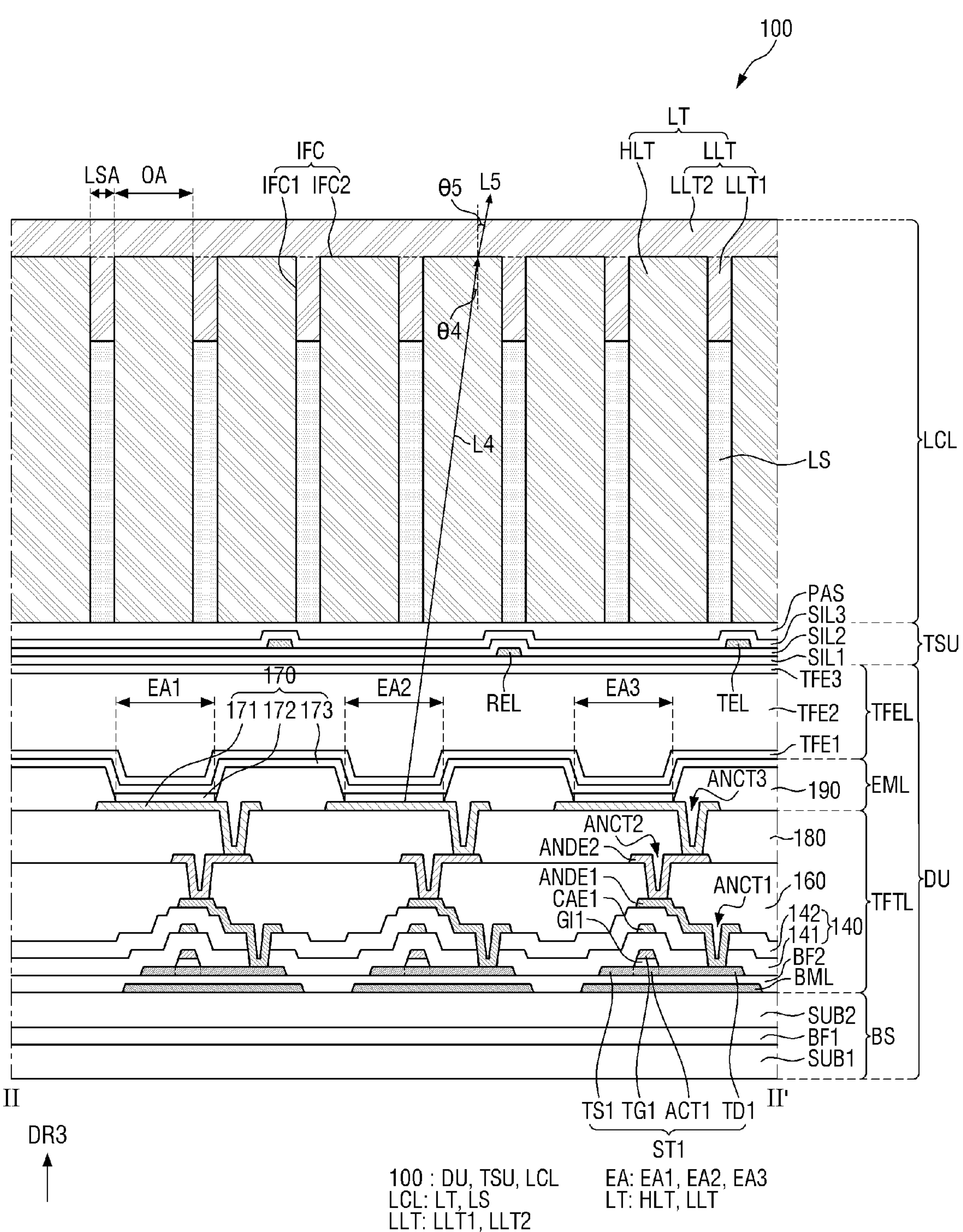
FIG. 11 is a cross-sectional view of a display panel and a light control layer taken along line II-II' of FIG. 7B according to another embodiment.

FIG. 11 is a cross-sectional view of a display panel and a light control layer taken along line II-II' of FIG. 7B according to another embodiment.

A display device 10 according to the embodiment of FIG. 11 is different from the display device 10 according to the embodiment described above with reference to FIG. 8 and the like in that the former further includes a second low-refractive light-transmitting film LLT2.

More specifically, a low-refractive light-transmitting film LLT includes a first low-refractive light-transmitting film LLT1 and a second low-refractive light-transmitting film LLT2. In the following description, the first low-refractive light-transmitting film LLT1 and the second low-refractive light-transmitting film LLT2 are separately described for convenience of illustration, but the first low-refractive light-transmitting film LLT1 and the second low-refractive light-transmitting film LLT2 are physically connected with each other as a single element.

The first low-refractive light-transmitting film LLT1 is identical to the low-refractive light-transmitting film LLT of the display device 10 according to the embodiment described above with reference to FIG. 8 and the like; and, therefore, the redundant descriptions are omitted.

The second low-refractive light-transmitting film LLT2 is disposed on the high-refractive light-transmitting film HLT and the first low-refractive light-transmitting film LLT1. The second low-refractive light-transmitting film LLT2 is disposed on the high-refractive light-transmitting film HLT and the first low-refractive light-transmitting film LLT1 across the entire surface. In this example, the high-refractive light-transmitting film HLT is disposed in the open area OA, and the first low-refractive light-transmitting film LLT1 is disposed in the non-open area LSA. The refractive indices of the first low-refractive light-transmitting film LLT1 and the second low-refractive light-transmitting film LLT2 are smaller than a refractive index of the high-refractive light-transmitting film HLT.

At least, some portions of the side surface of the high-refractive light-transmitting film HLT are in direct contact with the first low-refractive light-transmitting film LLT1. At least, some portions of the upper surface of the high-refractive light-transmitting film HLT are in direct contact with the lower surface of the second low-refractive light-transmitting film LLT2.

The interface IFC between the low-refractive light-transmitting film LLT and the high-refractive light-transmitting film HLT includes a first interface IFC1 and a second interface IFC2. The first interface IFC1 is located where the side surface of the high-refractive light-transmitting film HLT and the first low-refractive light-transmitting film LLT1 meet each other. The second interface IFC2 is located where the side surface of the high-refractive light-transmitting film HLT and the second low-refractive light-transmitting film LLT2 meet each other.

The lights passing through the first interface IFC1 proceeds in the same manner as the first light L1 of the display device 10 according to the embodiment described above with reference to FIG. 8; and, therefore, the redundant descriptions are omitted.

A fourth light L4 is incident on the second interface IFC2 at a fourth angle θ4 with respect to a normal line perpendicular to the second interface IFC2. The fourth light L4 passing through the second interface IFC2 exits at a fifth angle θ5 which is larger than the fourth angle θ4, as indicated by a fifth light L5. Accordingly, the uniformity of the luminance and the uniformity of the light emission efficiency is improved within the effective viewing angle range of the display device 10 according to this embodiment.

Specifically, in Comparative Examples that do not include the low-refractive light-transmitting film LLT and the high-refractive light-transmitting film HLT, the fourth light LA does not pass through the second interface IFC2. Since the amount of the fourth light L4 incident at a smaller viewing angle is greater than the amount of the first light L1 incident at a larger viewing angle, the larger the viewing angle within the effective viewing angle range is, the greater the luminance and luminous efficiency are.

In contrast, according to this embodiment, the fourth light LA is incident on the interface IFC between the low-refractive light-transmitting film LLT and the high-refractive light-transmitting film HLT at a smaller viewing angle than the first light L1 in FIG. 8. Accordingly, by virtue of the fifth light L5 that exits at the fifth angle θ5 which is larger than the fourth angle θ4, which is the incident angle of the fourth light L4, the luminance and the light emission efficiency at a greater viewing angle are compensated by the light having a smaller incident angle. As a result, the uniformity of the luminance and the uniformity of the light emission efficiency is improved within the effective viewing angle range.

Figure 12:
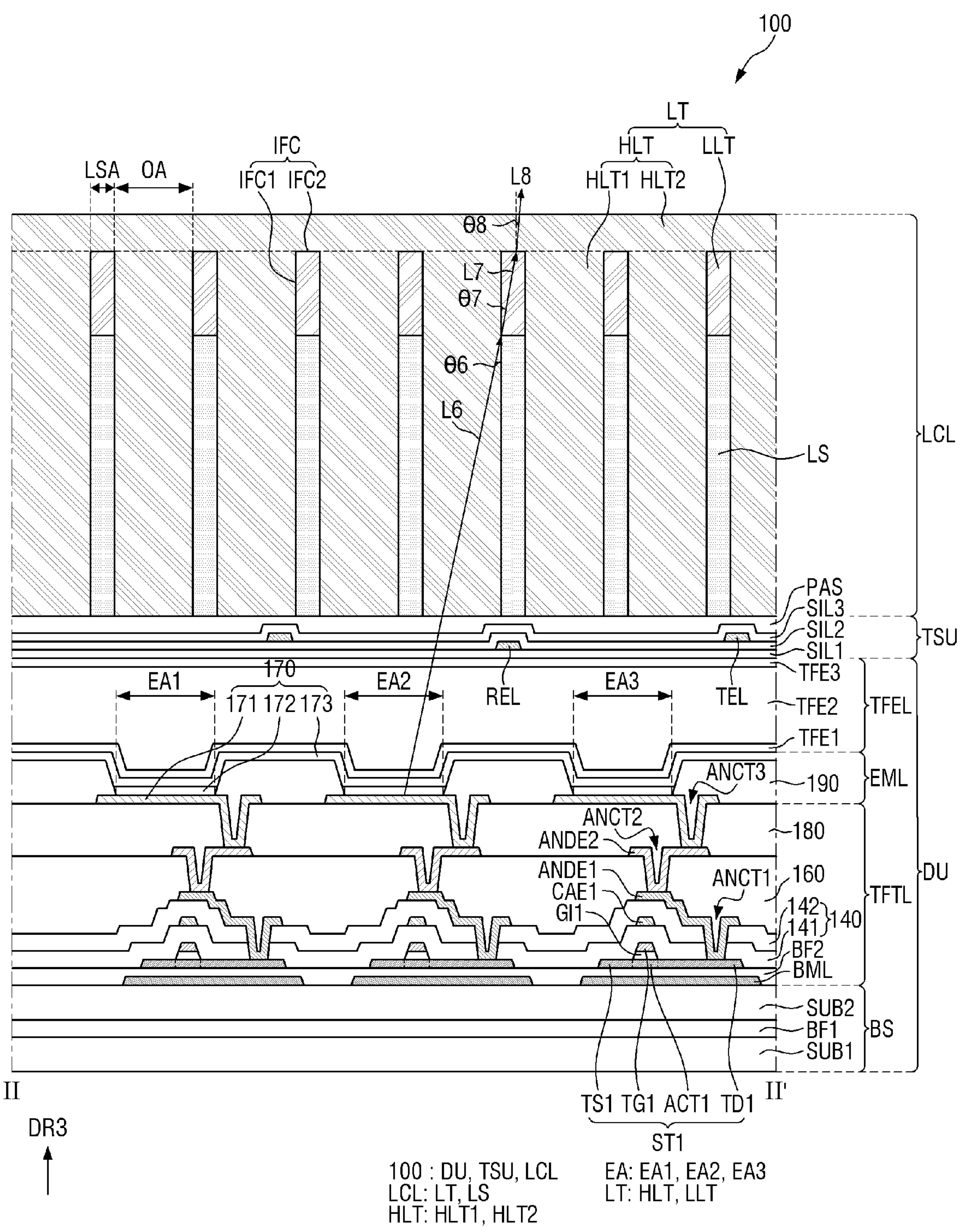
FIG. 12 is a cross-sectional view of a display panel and a light control layer taken along line II-II' of FIG. 7B according to yet another embodiment of the present disclosure.

FIG. 12 is a cross-sectional view of a display panel and a light control layer taken along line II-II' of FIG. 7B according to yet another embodiment of the present disclosure.

A display device 10 according to the embodiment of FIG. 12 is different from the display devices 10 according to the embodiments described above with reference to FIGS. 8 and 11 and the like in that the former further includes a second high-refractive light-transmitting film LLT2.

More specifically, a high-refractive light-transmitting film HLT includes a first high-refractive light-transmitting film HLT1 and a second high-refractive light-transmitting film HLT2. In the following description, the first high-refractive light-transmitting film HLT1 and the second high-refractive light-transmitting film HLT2 are separately described for convenience of illustration, but the first high-refractive light-transmitting film HLT1 and the second high-refractive light-transmitting film HLT2 are physically connected with each other as a single element.

The first high-refractive light-transmitting film HLT1 is identical to the high-refractive light-transmitting film HLT of the display device 10 according to the embodiment described above with reference to FIG. 8 and the like; and, therefore, the redundant descriptions are omitted.

The second high-refractive light-transmitting film HLT2 is disposed on the first high-refractive light-transmitting film HLT1 and the low-refractive light-transmitting film LLT. The second high-refractive light-transmitting film HLT2 is disposed on the first high-refractive light-transmitting film HLT1 and the low-refractive light-transmitting film LLT across the entire surface. The low-refractive light-transmitting film LLT is disposed in the non-open area LSA, and the first high-refractive light-transmitting film is disposed in the open area OA. The refractive index of the first low-refractive light-transmitting film LLT1 is smaller than the refractive indices of the first high-refractive light-transmitting film HLT1 and the second high-refractive light-transmitting film HTL2.

At least, some portions of the side surface of the first high-refractive light-transmitting film HLT1 are in direct contact with the side surface of the low-refractive light-transmitting film LLT. At least, some portions of the lower surface of the second high-refractive light-transmitting film HLT2 are in direct contact with the upper surface of the low-refractive light-transmitting film LLT.

The interface IFC between the low-refractive light-transmitting film LLT and the high-refractive light-transmitting film HLT includes a first interface IFC1 and a second interface IFC2. The first interface IFC1 is located where the side surface of the first high-refractive light-transmitting film HLT1 and the side surface of the low-refractive light-transmitting film LLT meet each other. The second interface IFC2 is located where the lower surface of the second high-refractive light-transmitting film HLT2 and the upper surface of the low-refractive light-transmitting film LLT meet each other.

A sixth light L6 is incident on the first interface IFC1 at a sixth angle θ6. The sixth light L6 passing through the first interface IFC1 exits at a seventh angle θ7 which is larger than the sixth angle θ6, as indicated by a seventh light L7. In addition, the seventh light L7 passing through the second interface IFC2 exits at an eighth angle θ8 which is smaller than the seventh angle θ7, as incident by an eighth light L8. Accordingly, the luminance and the light emission efficiency are improved within the effective viewing angle range of the display device 10 according to this embodiment.

Specifically, in the display device 10 according to this embodiment, if the sixth angle θ6 is greater than the effective viewing angle, the sixth light L6 is converted into the seventh light L7 at the first interface IFC1, and the seventh light L7 is converted into the eighth light L8 at the second interface IFC2 such that the sixth light L6 exits at the eighth angle θ8 which is smaller than the effective viewing angle. In other words, the sixth light L6 having the sixth angle θ6 greater than the effective viewing angle is converted into the eighth light L8 having the eighth angle θ8 smaller than the effective viewing angle to exit to the outside. Accordingly, the luminance of the display device 10 is improved within the effective viewing angle range by converting the lights having the sixth angle θ6 greater than the effective viewing angle into the eighth angle θ8 within the effective viewing angle range. As a result, the light emission efficiency of the display device 10 is improved within the effective viewing angle range.

In concluding the detailed description, those skilled in the art will appreciate that many variations and modifications can be made to the preferred embodiments without substantially departing from the principles of the present disclosure. Therefore, the disclosed preferred embodiments of the present disclosure are used in a generic and descriptive sense only and not for purposes of limitation.

What is claimed is:

1. A display device comprising:

a substrate;

an emission layer including a plurality of light-emitting elements to emit lights and disposed on the substrate; and a light control layer disposed on the emission layer, wherein the light control layer includes a light-transmitting film that transmits the lights and a light-blocking film that blocks the lights, wherein the light-transmitting film includes:

a first low-refractive light-transmitting film disposed on the light-blocking film; and a first high-refractive light-transmitting film alternately disposed with the light-blocking film, and wherein a refractive index of the first low-refractive light-transmitting film is smaller than a refractive index of the first high-refractive light-transmitting film.

2. The display device of claim 1, wherein the first low-refractive light-transmitting film overlaps the light-blocking film in a thickness direction of the substrate, and the first high-refractive light-transmitting film does not overlap the light-blocking film in the thickness direction of the substrate.

3. The display device of claim 1, wherein the first low-refractive light-transmitting film is disposed in a non-open area, and the first high-refractive light-transmitting film is disposed in an open area.

4. The display device of claim 1, wherein the first high-refractive light-transmitting film is alternately arranged with the first low-refractive light-transmitting film.

5. The display device of claim 1, wherein a side surface of the first high-refractive light-transmitting film is in direct contact with a side surface of the first low-refractive light-transmitting film to form a first interface.

6. The display device of claim 5, wherein some of the lights are totally reflected at the first interface.

7. The display device of claim 5, wherein some of the lights are refracted at the first interface toward a front side.

8. The display device of claim 1, wherein an angle formed between a side surface and a lower surface of the first low-refractive light-transmitting film is 90 degrees.

9. The display device of claim 1, wherein a thickness of the first low-refractive light-transmitting film is smaller than a thickness of the light-blocking film in a thickness direction of the substrate, and a thickness of the first high-refractive light-transmitting film is equal to a sum of the thickness of the first low-refractive light-transmitting film and the thickness of the light-blocking film.

10. The display device of claim 9, wherein the thickness of the first low-refractive light-transmitting film is 1.5 to 10 times less than the thickness of the light-blocking film in the thickness direction of the substrate, and the thickness of the first low-refractive light-transmitting film is equal to or less than 10 μm in the thickness direction of the substrate.

11. The display device of claim 1, further comprises a touch sensor layer disposed between the emission layer and the light control layer, wherein the first low-refractive light-transmitting film is disposed on the light-blocking film and spaced apart from the touch sensor layer in a thickness direction of the substrate, and the light-blocking film overlaps a non-emission area and an emission area of the emission layer.

12. The display device of claim 1, wherein the refractive index of the first low-refractive light-transmitting film is equal to or less than 97% of the refractive index of the first high-refractive light-transmitting film.

13. The display device of claim 12, wherein a difference between the refractive index of the first low-refractive light-transmitting film and the refractive index of the first high-refractive light-transmitting film is equal to or greater than 0.05.

14. The display device of claim 13, wherein the refractive index of the first low-refractive light-transmitting film is equal to or less than 1.5.

15. A display device comprising:

a substrate;

an emission layer including a plurality of light-emitting elements to emit lights and disposed on the substrate;

a touch sensor layer disposed on the emission layer; and a light control layer disposed on the touch sensor layer, wherein the light control layer includes a light-transmitting film that transmits the lights and a light-blocking film that blocks the lights, wherein the light-transmitting film includes:

a first high-refractive light-transmitting film disposed in an open area;

a first low-refractive light-transmitting film disposed in a non-open area; and a second low-refractive light-transmitting film, wherein refractive indices of the first and second low-refractive light-transmitting films are smaller than a refractive index of the first high-refractive light-transmitting film, and wherein the second low-refractive light-transmitting film is disposed on the first low-refractive light-transmitting film and the first high-refractive light-transmitting film.

16. The display device of claim 15, wherein a side surface of the first high-refractive light-transmitting film is in direct contact with a side surface of the first low-refractive light-transmitting film to form a first interface, and an upper surface of the first high-refractive light-transmitting film is in direct contact with a lower surface of the second low-refractive light-transmitting film to form a second interface.

17. The display device of claim 16, wherein some of the lights are refracted at the first interface toward a front side, and some others of the lights are refracted at the second interface toward a side surface.

18. A display device comprising:

a substrate;

an emission layer including a plurality of light-emitting elements to emit lights and disposed on the substrate;

a touch sensor layer disposed on the emission layer; and a light control layer disposed on the touch sensor layer, wherein the light control layer includes a light-transmitting film that transmits the lights and a light-blocking film that blocks the lights, wherein the light-transmitting film includes:

a first low-refractive light-transmitting film disposed in a non-open area;

a first high-refractive light-transmitting film disposed in an open area; and a second high-refractive light-transmitting film, wherein a refractive index of the first low-refractive light-transmitting film is smaller than refractive indices of the first and second high-refractive light-transmitting films, and wherein the second high-refractive light-transmitting film is disposed on the first low-refractive light-transmitting film and the first high-refractive light-transmitting film.

19. The display device of claim 18, wherein a side surface of the first low-refractive light-transmitting film is in direct contact with a side surface of the first high-refractive light-transmitting film to form a first interface, and an upper surface of the first low-refractive light-transmitting film is in direct contact with a lower surface of the second high-refractive light-transmitting film to form a second interface.

20. The display device of claim 19, wherein some of the lights are refracted at the first interface and the second interface toward a front side.

* * * * *